US008854814B2

(12) United States Patent
Liu et al.

(10) Patent No.: US 8,854,814 B2
(45) Date of Patent: Oct. 7, 2014

(54) HYBRID COOLING DESIGN FOR MODULAR SYSTEMS

(75) Inventors: Jinshui Liu, Plano, TX (US); Tian Yu, Cupertino, CA (US)

(73) Assignee: FutureWei Technologies, Inc., Plano, TX (US)

( * ) Notice: Subject to any disclaimer, the term of this patent is extended or adjusted under 35 U.S.C. 154(b) by 342 days.

(21) Appl. No.: 13/169,941

(22) Filed: Jun. 27, 2011

(65) Prior Publication Data
US 2012/0327597 A1 Dec. 27, 2012

(51) Int. Cl.
H05K 7/20 (2006.01)
G06F 1/20 (2006.01)
F28D 15/00 (2006.01)

(52) U.S. Cl.
CPC .............. *H05K 7/20736* (2013.01); *G06F 1/20* (2013.01); *F28D 15/00* (2013.01)
USPC .......................................... 361/695; 454/184

(58) Field of Classification Search
CPC ........ H05K 7/20736; H05K 7/20; G06F 1/20; G06F 2200/21; F28F 15/00
See application file for complete search history.

(56) References Cited

U.S. PATENT DOCUMENTS

| | | | | |
|---|---|---|---|---|
| 5,402,313 A | * | 3/1995 | Casperson et al. | 361/710 |
| 5,544,012 A | * | 8/1996 | Koike | 361/695 |
| 7,280,356 B2 | * | 10/2007 | Pfahnl et al. | 361/695 |
| 7,826,222 B2 | * | 11/2010 | Aybay et al. | 361/695 |
| 7,916,472 B1 | * | 3/2011 | Aybay et al. | 361/679.5 |
| 7,995,345 B2 | * | 8/2011 | Nguyen | 361/721 |
| 8,064,200 B1 | * | 11/2011 | West et al. | 361/695 |
| 8,120,912 B2 | * | 2/2012 | Aybay et al. | 361/695 |
| 8,125,779 B2 | * | 2/2012 | Aybay et al. | 361/695 |
| 8,238,094 B1 | * | 8/2012 | Aybay et al. | 361/679.5 |
| 2006/0126292 A1 | * | 6/2006 | Pfahnl et al. | 361/695 |
| 2009/0264145 A1 | * | 10/2009 | Kazakevich et al. | 455/522 |
| 2010/0014248 A1 | * | 1/2010 | Boyden et al. | 361/695 |

OTHER PUBLICATIONS

"Airblock Data Center Curtains," Simplex Isolation Systems, Inc., www.simplexstripdoors.com/dccurtains.htm, published at least as early as Jan. 29, 2011, downloaded Sep. 6, 2011, 2 pages.
"HP BladeSystem c7000 Enclosure—Specifications," Hewlett-Packard Developement Company, http://h18000.www1.hp.com/products/blades/components/enclosures/c-class/c700, published at least as early as Jan. 29, 2011, downloaded Sep. 6, 2011, 2 pages.
"7500 Series Data Center Switch, Data Sheet," Arista Networks, Inc., www.aristanetworks.com, published at least as early as Jan. 29, 2011, downloaded Sep. 6, 2011, 7 pages.
"Sun Datacenter Switch 3456," Sun Microsystems, Inc., Nov. 2007, 2 pages.

(Continued)

Primary Examiner — Gregory Thompson
(74) Attorney, Agent, or Firm — Slater & Matsil, L.L.P.

(57) ABSTRACT

A system and method for chassis cooling is provided. A preferred embodiment comprises an orthogonal backplane along with a hybrid cooling air flow. One air flow is routed horizontally through aligned and suitable openings on the backplane, vertically over components to be cooled, and horizontally out of the chassis. A second air flow is routed horizontally over components and through aligned and suitable openings on the backplane before it is routed horizontally out of the chassis.

29 Claims, 20 Drawing Sheets

(56) References Cited

OTHER PUBLICATIONS

"Juniper Networks, Overview—EX8200 Ethernet Switches," Juniper Networks, Inc., www.juniper.net/us/en/products-services/switching/ex-series/ex8200 published at least as early as Dec. 1999, downloaded Sep. 6, 2011, 7 pages.
"Juniper Networks Introduces QFabric: The Foundation of Data Centers for the Next Decade," Juniper Networks, Inc., Feb. 23, 2011, 2 pages.
"Cisco Nexus 7000 Series Switch Chassis," Cisco System, Inc., Aug. 2011, 7 pages.
"Grid Director 4700—Switch System Product Brief," Mellanox Technologies, published at least as early as Jan. 29, 2011, 2 pages.
"Arista Quick Start Guide, Modular Data Center Switches DCS-7508 and DCS-7504," Arista Networks, published at least as early as Jan. 29, 2011, 28 pages.
"Mellanox Grid Director 4700 Installation Manual," Mellanox Technologies, published at least as early as Jan. 29, 2011, 88 pages.
"Complete Hardware Guide for EX8216 Ethernet Switches," Juniper Networks, Inc., Revision 8, Dec. 2010, 338 pages.
Vantage™ 8500 10GbE Switching For Scale-Out Data Centers and Cloud Computing Fabrics, Mellanox Technologies, 2011, Rev. 1.0, 2 pages.
De Jacquelot, "Voltaire Overview," Voltaire Inc., Mar. 22, 2010, 21 pages.
Sun™ Datacenter Switch 3456 and 3×24 Architecture, White Paper, Sun Microsystems, Jun. 2008, 50 pages.
"Environmental Specifications for Cisco Nexus 7000 Series Switches", Chapter 3 of Cisco Nexus 7000 Series Site Preparation Guide, Cisco, Feb. 8, 2013, 20 pages.
"Technologies in the HP Blade System c7000 Enclosure", Technology Brief, 6$^{th}$ Edition, HP, Dec. 7, 2011, 34 pages.
"Sun™ Datacenter Switch 3456 Service Manual", Sun Microsystems, Aug. 2008 Revision A, 94 pages.
"Voltaire® Vantage™ 8500 10 Gigabit Ethernet Switching for Scale-Out Data Centers and Cloud Computing Fabrics", Voltaire, P/N: DOC-00625 Rev. A01, Nov. 2009, 2 pages.
Arista 7508 Photo, Apr. 19, 2010, 1 page, publisher and place of publication unknown.
Arista Networks, Inc., "7500 Series Data Center Switch Data Sheet", Apr. 2010, 6 pgs.
Clapp, Mari Mineta, "Arista 7500—Sets New Standard for 10 Gigabit Ethernet Networking", Arista Networks, Inc., Menlo Park, California, Apr. 19, 2010, 2 pgs., http://www.aristanetworks.com/news/pressrelease/225-pr-20100419-01, last accessed May 2, 2014.
Cisco Systems, Inc., "Cisco Nexus 7000 Series Switch Preparative Procedures Wrapper," Nov. 2012, 19 pgs., Version 0.8.
Cisco Systems, Inc., "Cisco Nexus 7000 Series Chassis", Jul. 2009, 7 pgs.
Cisco Systems, Inc., Cisco Nexus 7000 (Japanese), Aug. 5, 2011, 66 pgs.
Cisco Systems, Inc., "Chapter 3: Technical Specifications", Cisco Nexus 7000 Series Site Preparation Guide, Undated but obtained on Mar. 14, 2011, 20 pgs.
Hewlett-Packard Development Company, L.P., "HP BladeSystem c7000 Enclosure", Mar. 2008, Technology Brief, 3rd Edition, 35 pgs.
Great Lakes Computer Source, "Great Lake Computer Reinstates Free HP c-Class Blade Server Offer to VMware vSphere Customers", PRWeb, Aug. 7, 2009, 2 pgs.. http://www.prweb.com/releases/2009/08/prweb2693904.htm, last accessed May 2, 2014.

* cited by examiner

HYBRID COOLING DESIGN FOR MODULAR SYSTEMS

TECHNICAL FIELD

The present invention relates generally to a system and method for providing cooling to electronic modules and, more particularly, to a system and method for providing cooling to a modular system such as a computer chassis that houses servers, data center network switch, or other similar data center equipment.

BACKGROUND

Generally, modular systems may utilize a backplane or midplane (hereafter the term of backplane is used for both a backplane or a midplane) in order to interconnect and organize a variety of modules (e.g., printed circuit boards or fans or power supply modules or other) within the modular system. For example, a backplane may be utilized in order to interconnect various functional modules such as blades to each other, to other chassis, and to external networks. Some backplanes may connect and organize the modules in a horizontal fashion, with each module connected to the backplane horizontally, while other backplanes may connect the modules in a vertical fashion. Additionally, other types of backplanes, such as an orthogonal backplane, may have a combination of connections, with some modules connected to the backplane horizontally and other modules connected to the backplane vertically.

However, while the orthogonal backplane configurations may have certain benefits, they also have certain drawbacks. For example, by having an orthogonal backplane configuration in which some modules are positioned vertically on one side of the backplane and other modules are positioned horizontally on another side of the backplane, cooling can become a major issue. In particular, the backplane and modules arranged in the orthogonal configuration create a complicated structure where a simple air flow over the modules is broken up by the various components and the backplane. This may become an even larger problem as processing and data transfer speeds continue their increases in speeds and heat generation.

FIG. 6A illustrates one attempt to cool an orthogonal backplane and its associated modules, as described in U.S. Pat. No. 7,826,222 (the "'222 Patent") to Aybay, et. al. As shown in FIG. 6A (which is a reprint of the '222 Patent's FIG. 10), this patent describes horizontal modules connected to a backplane and located in a front of a chassis along with vertical modules connected to the backplane and located in a back of the chassis. As shown in FIG. 6A, cooling air is pulled from a front of the chassis and over the horizontal modules, through radial blowers, and out the rear of the chassis. Similarly shown in FIG. 6B (which is a reprint of the '222 Patent's FIG. 11), to cool the horizontal modules, cooling air is pulled in at the top of the front of the chassis, pulled across the top of the chassis to bypass the horizontal modules, induced by horizontal fans trays to pass over the vertical modules to provide cooling to the vertical modules before the cooling air is expelled out of the chassis at the back bottom of the chassis.

SUMMARY OF THE INVENTION

These and other problems are generally solved or circumvented, and technical advantages are generally achieved, by preferred embodiments of the present invention which provide for the cooling of a chassis housing electronic modules.

In accordance with a preferred embodiment of the present invention, an electronic system comprising a first region adjacent to a first side, the first region comprising first sections for accepting first modules positioned in a first direction is provided. A second region is adjacent to a second side, the second side being opposite the first side, the second region comprising second sections for accepting second modules positioned in a second direction orthogonal to the first direction. A hybrid air flow path comprises a first air flow path having a first entrance in the first side, a first portion beneath the first region, a second portion between the second sections, and a first exit either through openings on top parts of faceplates of the second modules or through fans in the second side, and a second air flow path having a second entrance at the first side through openings on faceplates of the first modules in the first region, a third portion between the first sections, aligned and suitable openings on a backplane, and a second exit in the second side.

In accordance with another preferred embodiment of the present invention, a chassis comprising a first region located in a front of the chassis, the first region having horizontal sections, and a second region located in a back of the chassis, the second region having vertical sections, is provided. First fans are located to induce air to flow beneath the first region, flow through the second region, and exit the back of the chassis, and second fans are located to induce air to flow through the first region and exit the back of the chassis.

In accordance with yet another preferred embodiment of the present invention, a cooling system for a chassis comprising first modules located in a front region of the chassis and second modules located in a rear region of the chassis, the second modules arranged orthogonally to the first modules, is provided. A first entrance is at a front of the chassis, a first exit is at a back of the chassis, and a first path is between the first entrance and the first exit, wherein the first path is a reverse Z and passes between the second modules. A second entrance, a second exit, and a second path between the second entrance and the second exit, wherein the second path passes between the first modules is also provided.

In accordance with yet another preferred embodiment of the present invention, a chassis comprising a first set of rails aligned in a first direction located in a front region of the chassis and a second set of rails aligned in a second direction orthogonal to the first direction, the second set of rails located in a back region of the chassis is provided. A first air flow path having a first horizontal portion beneath the front region, having a first vertical portion through the back region, and having a first exit out of a back of the chassis is provided and a second air flow path having a second portion through the front region and having a second exit out of the back of the chassis is provided.

In accordance with yet another preferred embodiment of the present invention, a method of cooling modules in a chassis, the method comprising providing a first plurality of modules in a front region of the chassis and a second plurality of modules in a rear region of the chassis, the first plurality of modules being orthogonal to the second plurality of modules, the front region being adjacent to a front of the chassis and the rear region being adjacent to a rear of the chassis is provided. Air is induced to flow between the first plurality of modules and out of a first opening in the rear of the chassis and air is induced to flow beneath the front region of the chassis, vertically between the second plurality of modules, and out of a second opening in the rear of the chassis.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a cooling system to provide cooling to an orthogonal backplane interconnected modular system. The invention may also be applied, however, to other cooling systems.

The specific embodiments of the present invention relate to a cooling airflow design methodology with a combination of a straight-forward front-to-rear airflow for front-side modules and a "Z"-shaped airflow for rear-side modules in a chassis-based modular system. As an example, the chassis-based modular system may include an orthogonal backplane with a combined air flow to cool modules within a modular system with a first region located in the front of the chassis and a second region located in the back of the chassis. First fans may be used to induce air to flow beneath the first region, flow through the second region, and exit the back of the chassis. Second fans may be used to induce air flow through the first region and exit the back of the chassis.

Figure 1A:
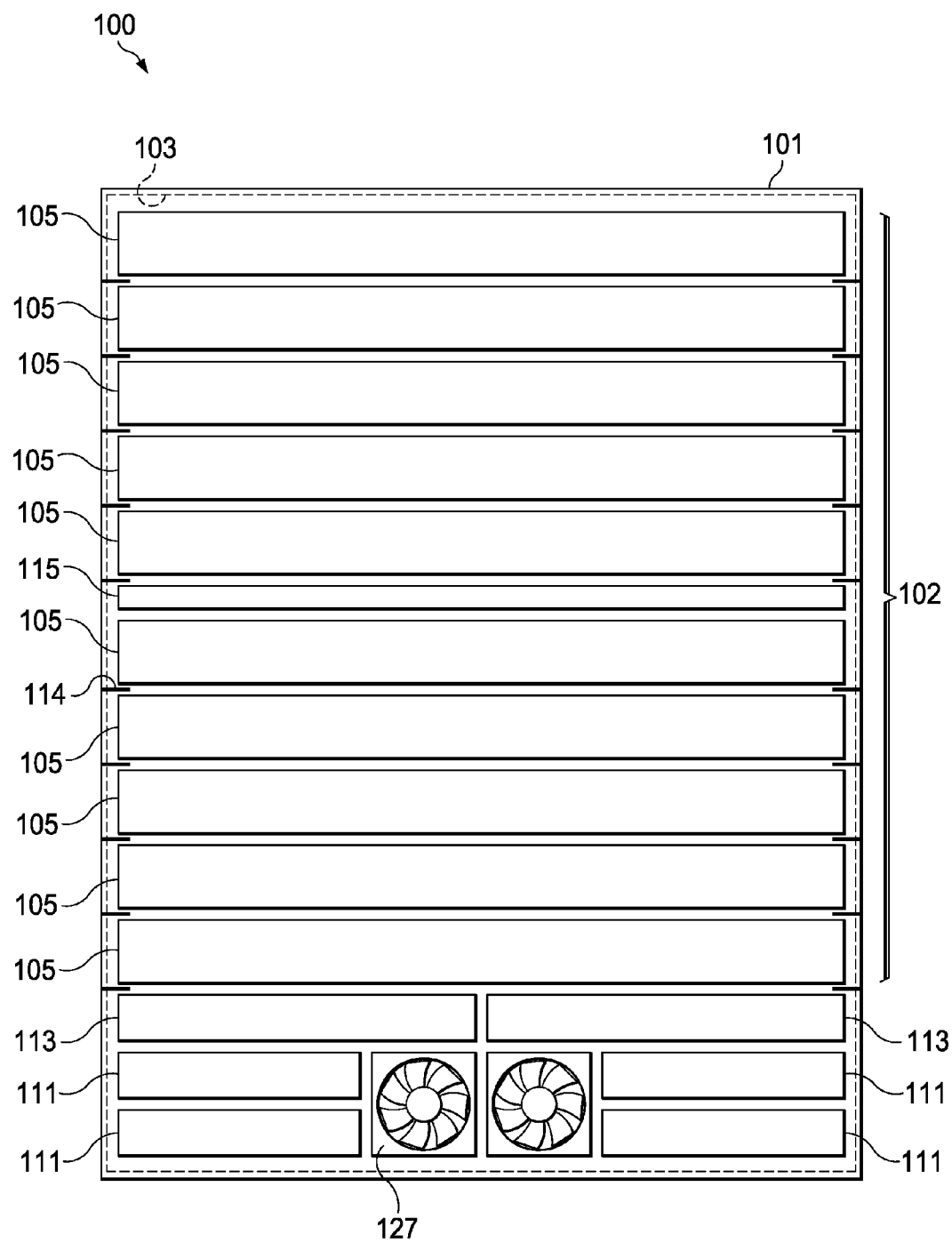
FIGS. 1A-1D illustrate a chassis with first fans in the front middle of the chassis and second fans along the back edges of the chassis in accordance with an embodiment of the present invention.

With reference now to FIG. 1A, there is shown a front view of a system 100 with a chassis 101. However, as one of ordinary skill in the art will recognize, the embodiment illustrated in FIG. 1A and the rest of the figures are merely illustrated embodiments of the present invention, and while specific details may be presented about the embodiments illustrated, the details are fully intended to be illustrative only, and are not intended to limit the present invention to the precise details described herein.

In the embodiment illustrated in FIG. 1A, the chassis 101 houses a backplane 103 (hidden from view in FIG. 1A by the other components but represented by a dashed line) and also provides horizontal sections 102 into which a plurality of horizontal first modules 105 are connected to the backplane 103. The chassis 101 is used to position and protect the various components of the system 100 (including, e.g., the backplane 103 and the horizontal first modules 105). The chassis 101 may comprise a single housing that encloses all or portions of the various components, or else may simply be a tray or frame which provides support for the components without an external housing, such as providing support rails for each of the horizontal first modules 105. For example, the chassis 101 may fit into the 19-inch wide rack with a height of 24.5 inches (otherwise known as 14U), although any other suitable size may alternatively be utilized.

Figure 1B:
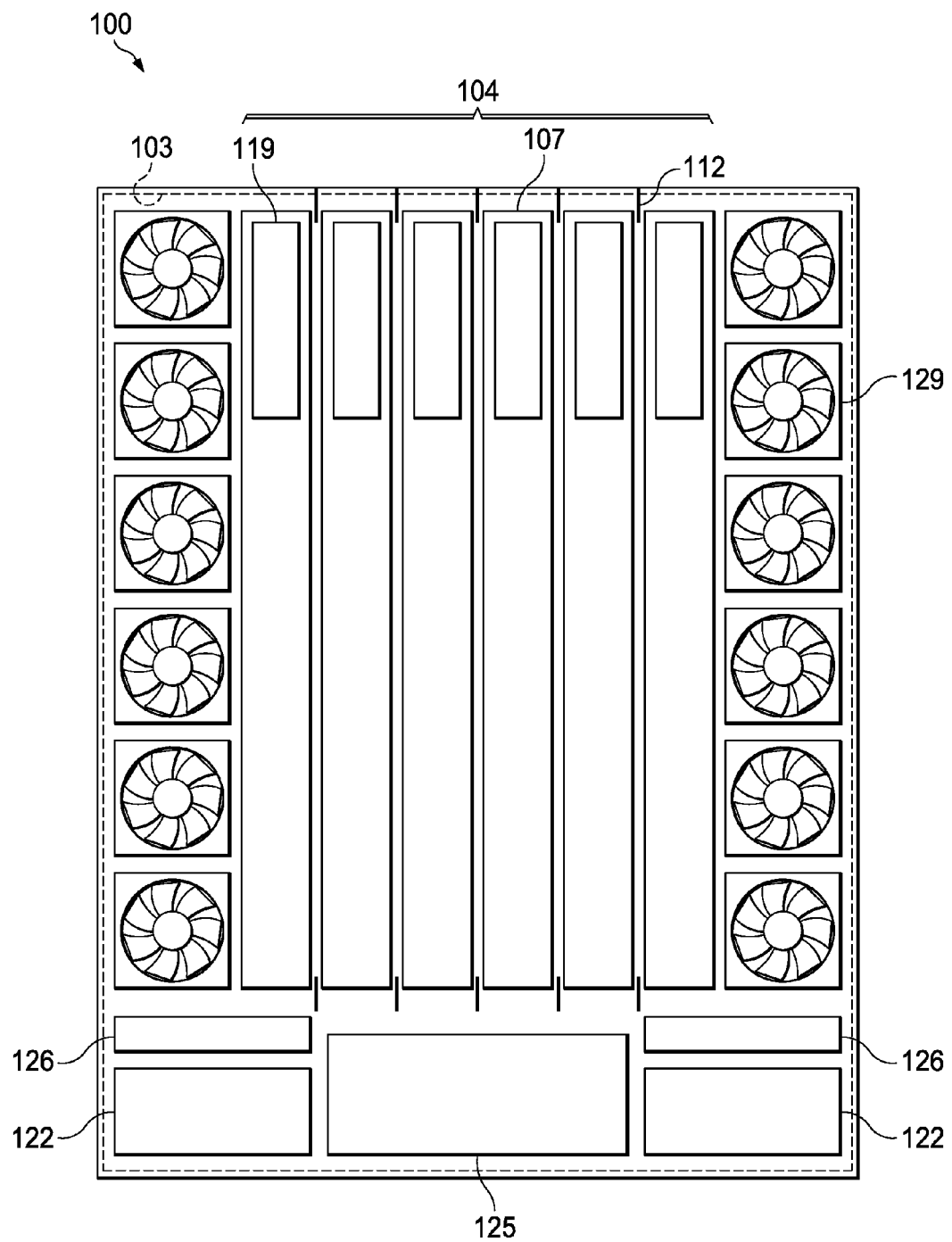

Attached to the chassis 101 is the backplane 103, which may be a printed circuit board having a plurality of interfaces or slots for the horizontal first modules 105 (discussed further below) and vertical second modules 107 (not shown in FIG. 1A but illustrated in FIG. 1B). The backplane 103 may be arranged in an orthogonal fashion, with the horizontal first modules 105 located in the front of the chassis 101 connected to the backplane 103 in a horizontal position (relative to the chassis 101) while the vertical second modules 107 are connected to the back of the chassis 101 (as shown in FIG. 1B below) in a vertical position (again relative to the chassis 101). In this manner the components of the system 100 connected to the front of the backplane 103 (e.g., the horizontal first modules 105) are positioned to be orthogonal to the components of the system 100 connected to the back of the backplane 103 (e.g., the vertical second modules 107).

The backplane 103 may be a FR4 backplane using orthogonal connectors such as, for example, the XCeded or Crossbow Orthogonal Backplane connectors from Amphenol-TCS, and supports data rate of 10 Gbps to 25 Gbps over a differential pair.

Further, it should be noted that, while the backplane 103 is referred to herein as a "backplane," and is described with very specific specifications, this terminology and described embodiments are not intended to limit the embodiments of the present invention. In particular, the term "backplane" is not intended to limit the backplane 103 to an embodiment in which only one side of the backplane 103 comprises connections for the horizontal first modules 105 and the vertical second modules 107. Rather, the backplane 103 is fully intended to include any arrangement of connections on the front side or rear side of the backplane 103 to allow for connections. As such, while the embodiments described herein use the term "backplane," the backplane 103 may also be termed a "midplane" and still remain within the scope of the present embodiments. Additionally, the precise description, including the number of slots, data transfer rates, etc., are meant to be merely illustrative and are not intended to limit the present embodiments in any fashion.

The horizontal first modules 105 are connected to the front of the backplane 103 (as can be seen in the front view of the chassis 101 in FIG. 1A), and may be, as illustrative examples only, Server or Input/Output (SIO) blades such as server blades, linecard blades, combinations of these, or the like. In an embodiment in which the horizontal first modules 105 are SIO blades and the SIO blades are server blades, the horizontal first modules 105 provide modular and scalable computer services such as data processing, storage, routing, or other functions for the system 100. Accordingly, the horizontal first modules 105 may each comprise a processor, memory modules, PCI cards, etc, and other functional components, in order to provide for the desired functionality, such as data processing, storage, routing, connectivity, translation, encoding/decoding, and the like. Other components which may be shared between horizontal first modules 105, such as power supplies and cooling, may be shared between all of the horizontal first modules 105 through the backplane 103 and the chassis 101. As such, each of the horizontal first modules 105 may comprise each of the components for the functionality while optimizing space by sharing non-functional components between the horizontal first modules 105.

Alternatively, in an embodiment in which the horizontal first modules 105 are linecard blades, the horizontal first modules 105 may provide an interface to an external network (not shown). As such, the horizontal first modules 105 may provide connectivity, translation, encoding/decoding, and other communication functionality between the external network and the remainder of the horizontal first modules 105. Similar to the server blades discussed above, the linecard blades may physically comprise all of the functional circuitry that may be needed to provide the interface, while optimizing space by sharing other functions such as power supplies and cooling with the other horizontal first modules 105.

In an embodiment, the chassis 100 may comprise ten horizontal regions 102 to support a plurality of ten horizontal first modules 105 connected to the backplane 103 in a horizontal position and supported by horizontal rails 114, as illustrated in FIG. 1A. In addition, the horizontal first modules 105 may be spaced apart from each other with a pitch such as 1.75 inches generally referred to herein as 1U or 1RU. However, the precise number and spacing of the horizontal first modules 105 described herein are intended to be illustrative only, and the described embodiments are not intended to be limiting. More or less than the number and spacing of the horizontal first modules 105 described herein may be used as desired for the overall design of the system.

FIG. 1A also illustrates a number of peripheral components that may also be connected on the backplane 103 to the front of the chassis 101. For example, load sharing power supplies 111 may be connected to the backplane 103 in order to provide power to the various components such as the horizontal first modules 105 and the vertical second modules 107 that connected to the backplane 103. The load sharing power supplies 111 may be cooled similarly to the rest of the components in the system 100 as described herein or else may contain their own integrated fans in order to help the load sharing power supplies 111 remain cool with front-to-rear airflow.

Control blades 113 may also be connected to the front of the backplane 103 in order to control the operation of the modular system during start-up and operation. For example, upon start-up the control blades 113 may be used to detect the presence or absence of components within the various connections on the backplane 103, and may also determine the status of each component that is present. During operation of the backplane 103, the control blades 113 may periodically scan the backplane 103 to determine if new components (e.g., a new first module 105) have been added to the backplane 103 during operation and, if one has been added, power up and integrate the new component with the rest of the components on the backplane 103. In some modular systems, the control blades 113 may simply be another of the horizontal first modules 105.

As illustrated in FIG. 1A, two control blades 113 may be connected to the backplane 103 in order to provide a primary control blade along with a backup secondary control blade. In such an embodiment, the primary control blade may monitor and control the components connected to the backplane 103 while the secondary control blade may monitor the primary control blade. If the primary control blade fails or otherwise gives up control of the backplane 103, the secondary control blade may immediately take over, thereby minimizing any disruption caused by the primary control blade failing.

Optionally, a mechanical stiffener 115 may be part of the chassis 101 to provide stronger mechanical support. The mechanical stiffener 115 may be used to provide additional support beyond the inherent structural support already present within the backplane 103. The additional support can be used to ensure that there is no undesired deformation of the backplane 103 when the horizontal first modules 105 and the vertical second modules 107, along with other components, are connected to the backplane 103 and begin to apply uneven forces to the backplane 103.

FIG. 1B illustrates a rear view of the chassis 101, which may house the vertical second modules 107 in vertical sections 104 supported by vertical rails 112. The vertical second modules 107 may be attached to the backside of the backplane 103 through slots within the backplane 103. In an embodiment in which the backplane 103 is an orthogonal backplane and the horizontal first modules 105 are arranged horizontally, the vertical second modules 107 are connected to the backplane 103 vertically.

The vertical second modules 107 may be, e.g., fabric blades that may be used to form functional interconnections between the various horizontal first modules 105 and other components. In an embodiment in which the horizontal first modules 105 are server blades, the vertical second modules 107 may provide interconnection between the individual horizontal first modules 105, and/or network connectivity to an external network (not shown). Alternatively, if the horizontal first modules 105 are linecard blades, the vertical second modules 107 may provide interconnectivity between the individual horizontal first modules 105 as well as providing network aggregation function between multiple chassis.

Similar to the horizontal first modules 105, the vertical second modules 107 may physically include the functional components that may be needed to provide the desired interconnectivity functionality. Other elements, such as the power supply and cooling components, may be located elsewhere within the chassis 101 and shared between the various components such as the horizontal first modules 105 and the vertical second modules 107. This allows the shared components to be optimized for all of the components of the system while still providing for the functionality of each of the individual vertical second modules 107.

Optionally, each of the vertical second modules 107 may include a first air flow opening 119. This first air flow opening 119 provides a path for airflow to flow away from the surfaces of the vertical second modules 107 and, eventually, out of the chassis 101. The first air flow opening 119 could be as simple as being an open space, an open space with a screen, a series of smaller openings, combinations of these, or the like, depending on the desired overall design. Further, the backplane 103 may, as illustrated in FIG. 1B, connect six vertical second modules 107 in a vertical configuration, although the precise number of vertical second modules 107 is not limited to six, and may be more or less depending upon the desired overall design.

Additional to the vertical second modules 107, a number of management components may also be connected to the back side of the backplane 103. For example, system management components 126 may be included in order to manage the operations of all other circuit boards, power supply modules and fans. The chassis 101 may also have additional air outlets 122 to exhaust hot air from power supplies 111 along with an external power entry opening 125 through the back side of the chassis 101 in order to allow for an external power source (not shown) to be connected to the chassis 101. Air outlets 122 and power entry 125 may also be one part. Once connected, the external power source can supply power to the load sharing power supplies 111 located within the chassis 101, which can then supply power to the individual components of the chassis 101.

FIGS. 1A and 1B additionally illustrate the placement of first fans 127 and second fans 129 around the chassis 101. In the embodiment illustrated in FIGS. 1A and 1B, there are two first fans 127 located in the middle along the bottom of the front of the chassis 101. The first fans 127 may be, e.g., two 80 mm fans, although any other suitably sized fan, such as 60 mm fans, 92 mm fans, 100 mm fans, or the like, may alternatively be utilized.

While the first fans 127 are located in the front of the chassis 101, the second fans 129 may be located in the back of the chassis 101. In the embodiment illustrated in FIG. 1B, there is one second fan 129 in each group for every two slots in the front of the backplane 103 (shown in FIG. 1A connected to the horizontal first modules 105, the mechanical stiffener 115 and the control blades 113). As such, in this embodiment twelve second fans 129 may be arranged, e.g., vertically in two rows of six second fans 129 each along the outside edges of the chassis 101 adjacent to the vertical second modules 107. Similar to the first fans 127, the second fans 129 may be, e.g., 80 mm fans, or any other suitably sized fan, such as 60 mm fans, 92 mm fans, 100 mm fans, or the like, and more or less fans may alternatively be utilized if desired.

The first fans 127 and the second fans 129 are utilized to induce an air flow across the individual components within the chassis 101 (e.g., the horizontal first modules 105 and the vertical second modules 107). As the air flows across the individual components, the difference in temperature between the air and the individual components will induce heat to transfer from the individual components into the air, thereby cooling the individual components. After being heated through the heat transfer, the air then continues to flow out of the chassis 101, thereby completely removing the heat from the individual components.

Figure 1C:
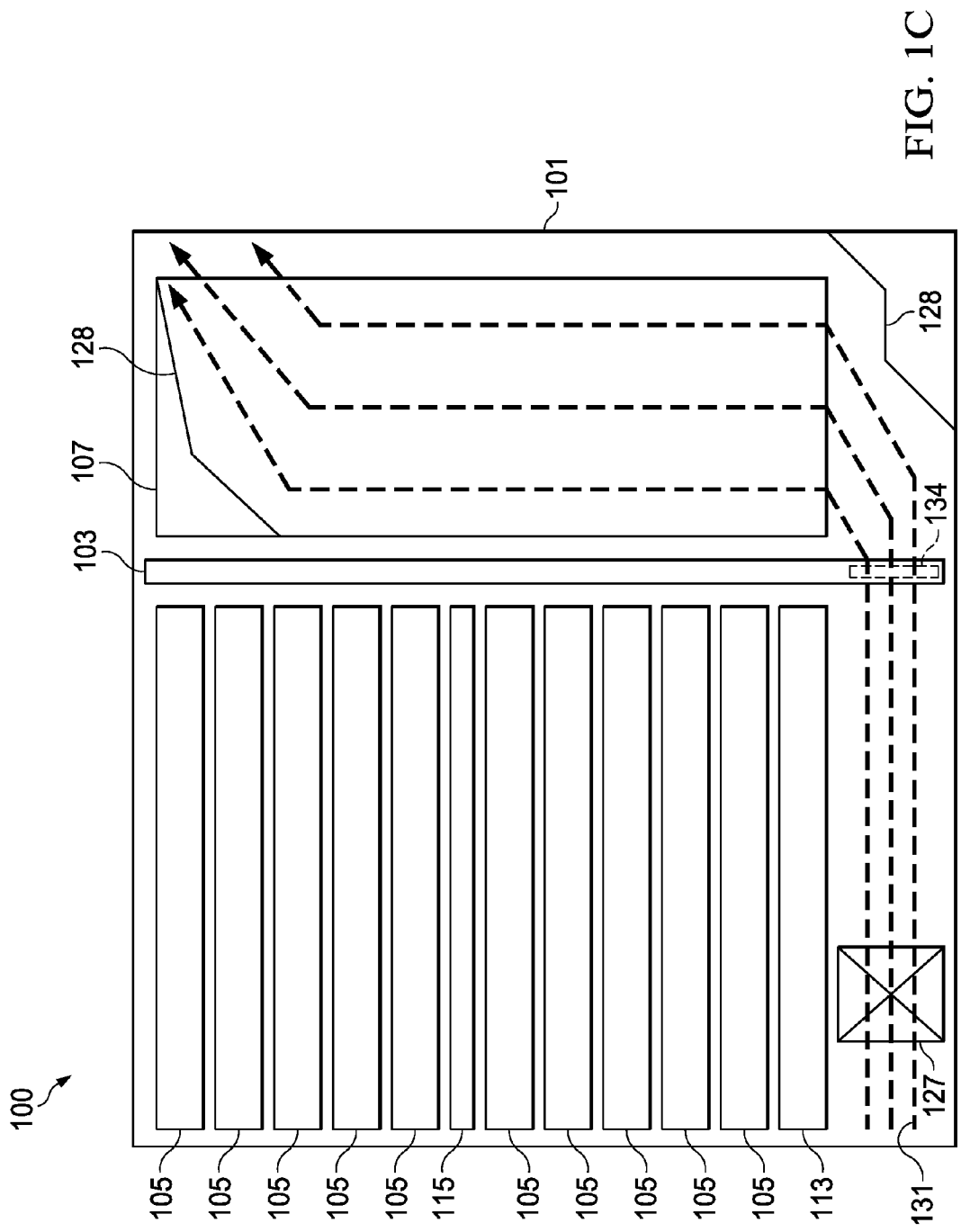

FIG. 1C illustrates a side view of FIG. 1A and illustrates a path for a first air flow (represented in FIG. 1C by the dashed lines 131) that is induced by the first fans 127 within the chassis 101. As illustrated, the first fans 127 pull in external air from outside of the chassis 101 and routes the external air beneath the horizontal first modules 105 and through an opening 134 on the backplane 103. As such, the external cool air is introduced across the vertical second modules 107 without the external air being significantly heated by the horizontal first modules 105.

Once the external air has been routed to the back of the chassis 101, the external air is directed vertically so that it passes over the vertical second modules 107. The external air may be directed simply by hitting the back of the chassis 101. However, as such an impact on a flat wall would reduce the overall efficiency of the cooling, the external air may optionally be directed vertically by an air turner 128 located at the back of the bottom of the chassis 101. The air turner 128 may comprise a series of angled surfaces to gradually direct the first air flow 131 vertically without the first air flow 131 hitting a vertical wall. The air turner 128 may be, e.g., a piece of sheet metal that is placed to provide a series of smaller, angular surfaces, although any other suitable material may alternatively be utilized.

Additionally, it may be desirable to expand the first air flow 131 so as to more evenly direct the first air flow 131 across the vertical second modules 107. For example, in the embodiment in which there are two first fans 127, the first air flow 131 from the first fans 127 is initially flowing with a cross-section of about 160 mm (80 mm fans×2 fans). However, the vertical second modules 107 take up a cross-section of 9.6 inches (1.6 inches×6 modules) or about 244 mm. As such, a more efficient cooling across all of the vertical second modules 107 may be achieved by spreading out the first air flow 131 through, e.g., an air spreader 134 (not visible in FIG. 1C but shown in FIG. 1D beneath the vertical second modules 107). The air spreader 134 may be, e.g., similar to the air turner 128 and may be a piece of sheet metal that is positioned at an angle to the air flow in order to spread the first air flow 131 more evenly across the vertical second modules 107.

Once the external air has been introduced to the vertical second modules 107, the external air flows vertically through the chassis 101 and across the vertical second modules 107. As the external air flows across the vertical second modules 107, heat is transferred from the vertical second modules 107 to the air, thereby heating the air while also simultaneously cooling the vertical second modules 107. After the air has been heated, the air may then exit the chassis 101 horizontally through the first air flow openings 119 (see FIG. 1A) located within the vertical second modules 107. Optionally, another air turner 128 may be placed at the top of the second modules 107 in order to better direct the first air flow 131 out of the first air flow openings 119.

As seen from the side view in FIG. 1C, the first air flow 131 from the front of the bottom of the chassis 101 to the top of the back of the chassis 101 resembles a backwards "Z" shape, with the first air flow 131 being directed horizontally along the bottom of the chassis 101, vertically over the vertical second modules 107, and then horizontally out of the first air flow openings 119. Additionally, the first air flow 131 may be spread more evenly across the vertical second modules 107 (in a direction into and out of FIG. 1C) through the use of the air spreader 134. This first air flow 131 allows for the efficient entry, heating, and removal of the external air in order to cool the vertical second modules 107.

Figure 1D:
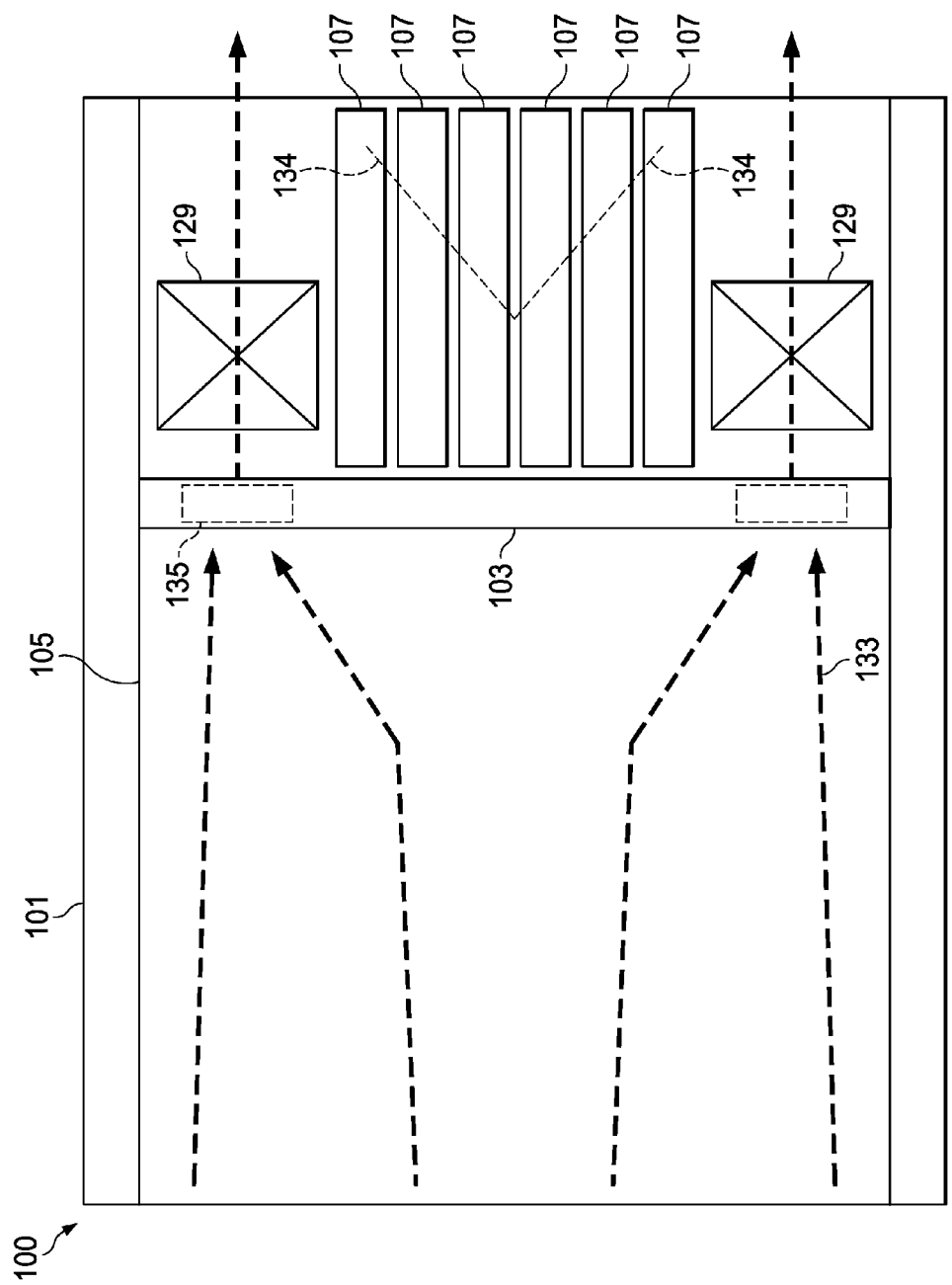

FIG. 1D illustrates a top-down view of the chassis 101 showing a second air flow (represented in FIG. 1D by the dashed lines 133) induced by the second fans 129 across the horizontal first modules 105. As illustrated, the second fans 129 pull in external cool air from the front of the chassis 101 through, e.g., openings on the faceplates of horizontal first modules 105 and passes the external air over and around the horizontal first modules 105 (one of which is visible in FIG. 1D). The second air flow 133 may flow through third air flow openings 135 located on the backplane 103, and the second air flow 133 is then expelled through the backside of the chassis 101 by the second fans 129.

Similar to the cooling of the vertical second modules 107, as the external cool air flows over the horizontal first modules 105, the heat from the horizontal first modules 105 is transferred to the air, thereby heating the air while simultaneously cooling the horizontal first modules 105. The heated air is then expelled from the chassis 101 through the second fans 129, thereby cooling the horizontal first modules 105 within the chassis 101.

The first air flow 131 and the second air flow 133 in combination form a hybrid air flow from the two separate air flows. This hybrid air flow is able to provide external air to both the horizontal first modules 105 and the vertical second modules 107 even if the horizontal first modules 105 and the vertical second modules 107 are connected to the backplane 103 in an orthogonal configuration. As such, the hybrid air flow is able to provide a more efficient cooling for each of the various types of components.

Figure 2A:
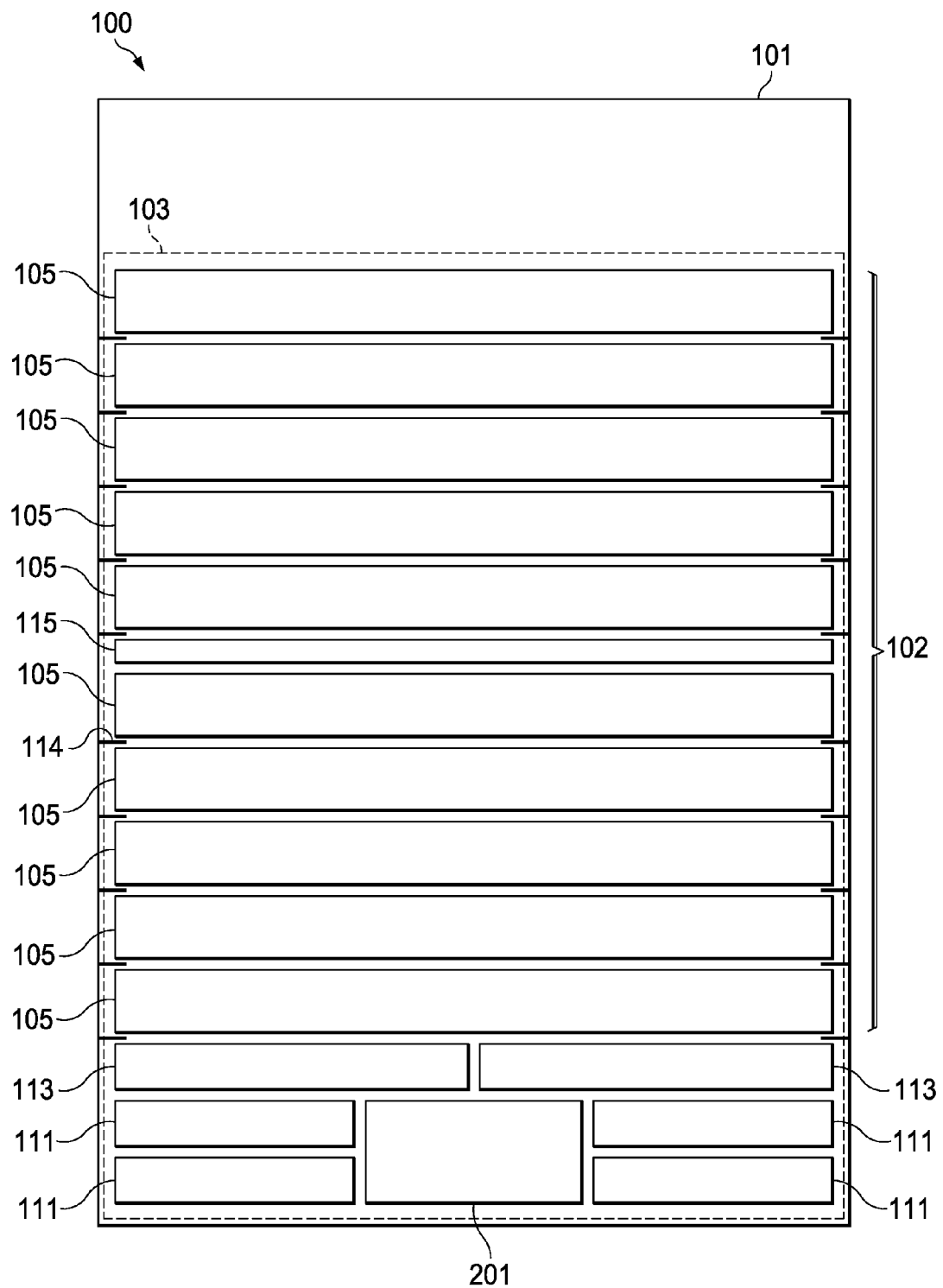
FIGS. 2A-2D illustrate a chassis with first fans in the back top middle of the chassis and second fans along the back edges of the chassis in accordance with an embodiment of the present invention.
Figure 2B:
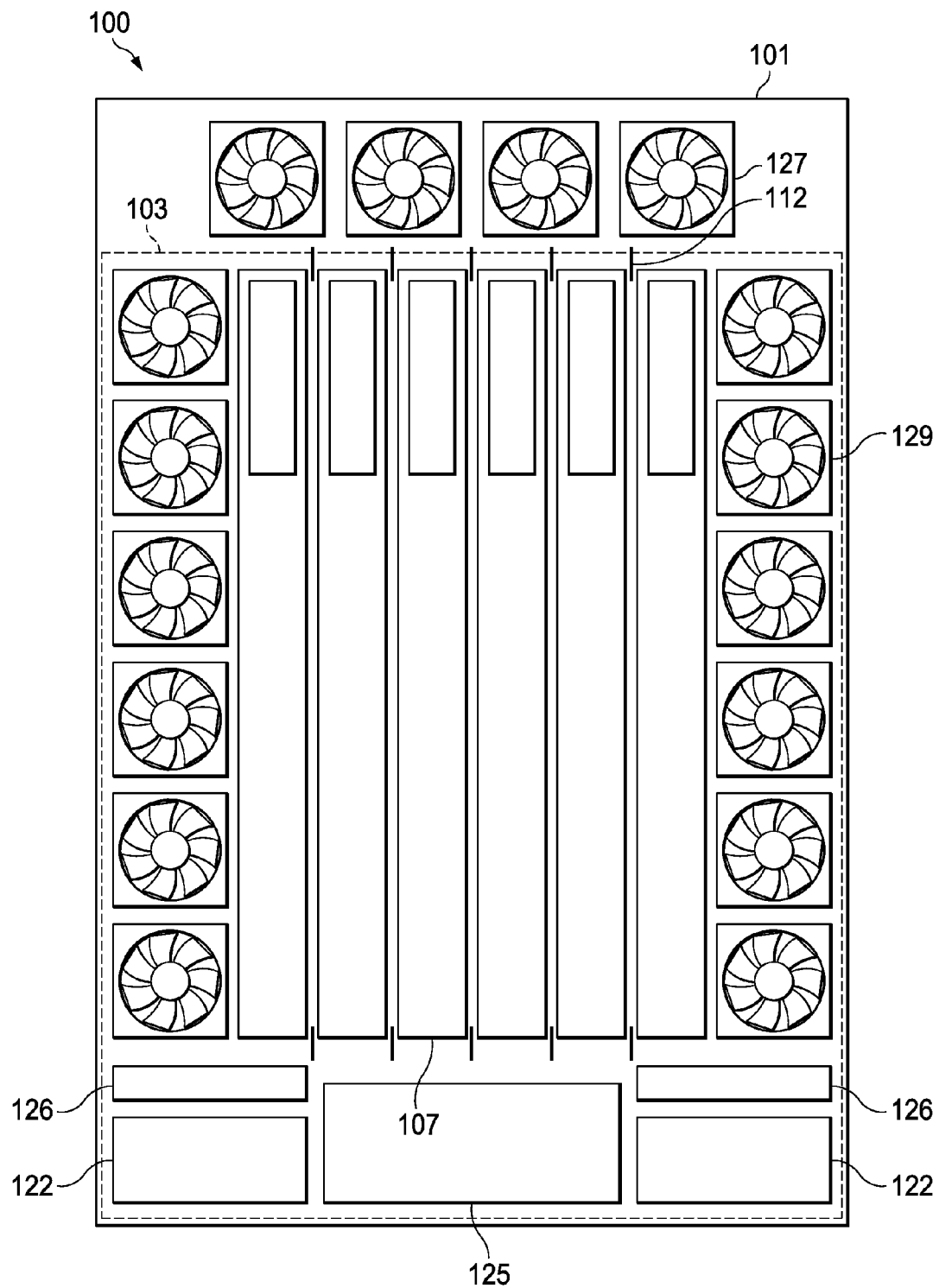
Figure 2C:
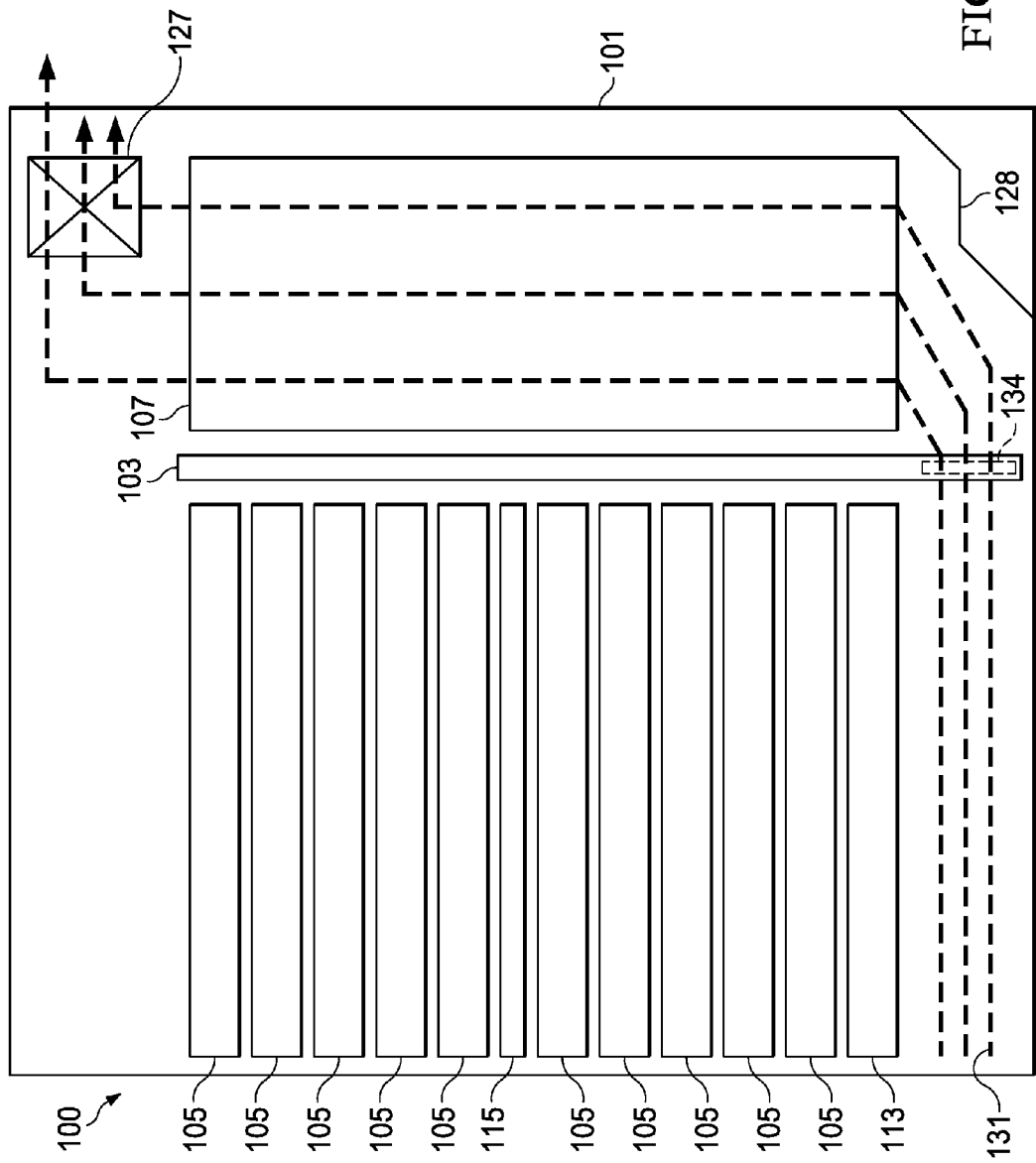
Figure 2D:
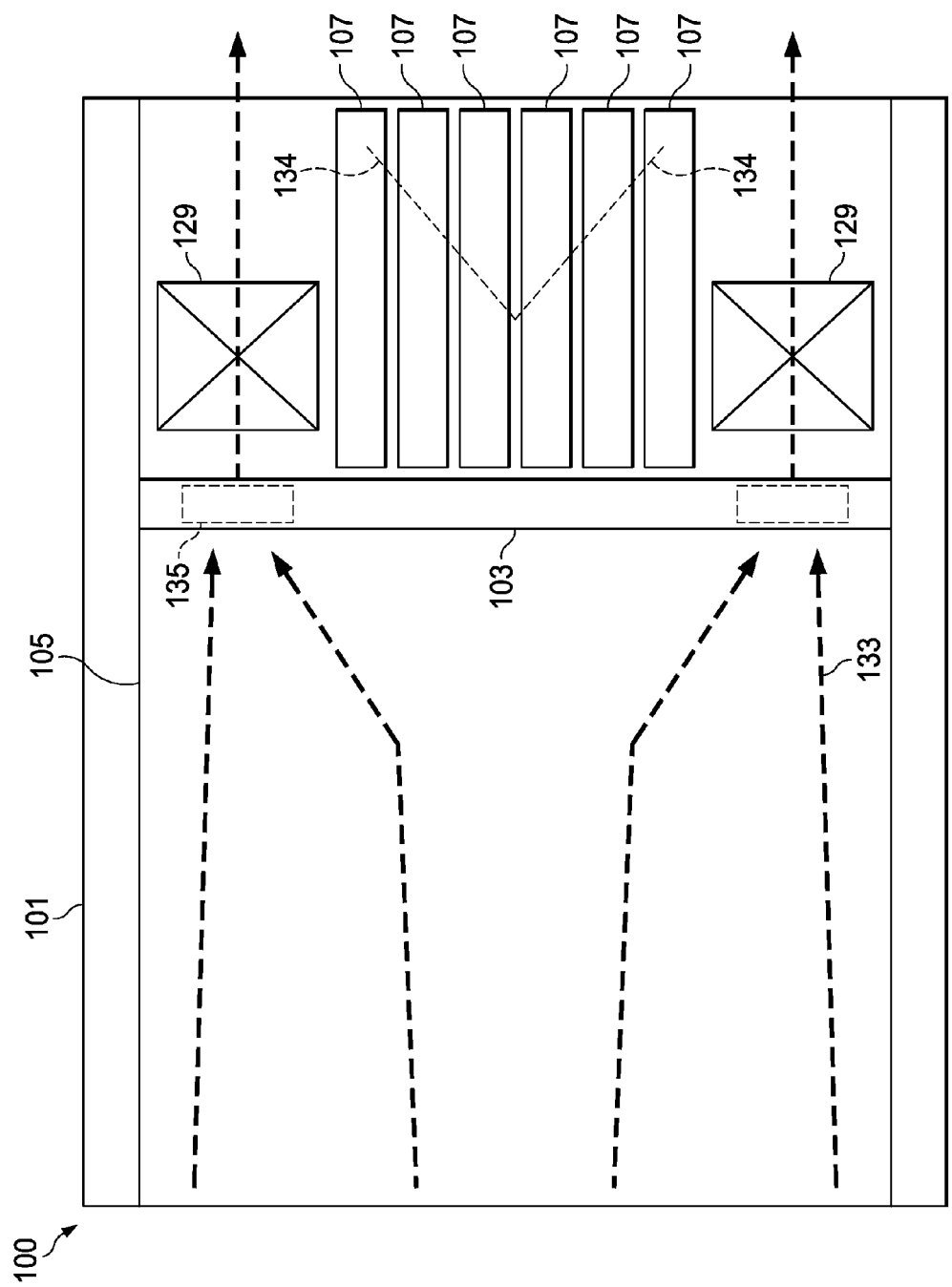

FIGS. 2A-2B illustrate a front-view and a back-view, respectively, of the chassis 101 in a second embodiment of the present invention, and FIGS. 2C-2D illustrate the first air flow 131 across the vertical second modules 107 and the second air flow 133 across the horizontal first modules 105 in this embodiment, respectively. In this embodiment the second fans 129 are located in a similar position as the second fans in the embodiment described above with respect to FIGS. 1A-1D. As such, the second air flow 133 induced by the second fans 129 across the horizontal first modules 105 is similar to the second air flow 133 as discussed above with respect to FIGS. 1A-1D. As such, the second air flow 133 illustrated in FIG. 2D is illustrated as being the same as the second air flow 133 illustrated in FIG. 1D.

However, in the second embodiment the first air flow 131 across the vertical second modules 107 is not pushed from the front of the chassis 101 but is instead pulled from the top back of the chassis 101. In particular, the first fans 127 are removed from the bottom of the front of the chassis 101 and are replaced with a third air flow opening 201 in order to allow external air to enter the chassis 101 from the bottom of the front of the chassis. The first fans 127, having been replaced by the third air flow openings 201 in the front of the chassis, are placed in the middle along the top of the back of the chassis 101, as can be seen in FIG. 2B.

In order to accommodate the first fans 127 along the top of the chassis 101, the chassis 101 may be extended upward a distance to accommodate the first fans 127. This extension allows not only for the placement of the two first fans 127 along the back top of the chassis 101, but also allows for additional fans to be included. For example, with the additional space, four first fans 127 may be included along the back top of the chassis 101 as illustrated in FIG. 2B.

By placing the first fans 127 along the top of the back of the chassis 101, the first fans 127, instead of inducing the external cool air by pushing the air across the vertical second modules 107, are instead pulling the external air across the vertical second modules 107. However, the first air flow 131 of the external air across the vertical second modules 107 is similar to the first air flow 131 as in the first embodiment (e.g., the reverse "Z" shape of air flow) in that the external cool air enters the chassis 101 through the bottom front of the chassis 101, travels beneath the horizontal first modules 105 and through openings on the backplane 103, then travels vertically over the vertical second modules 107 before entering the first fans 127 and exiting the chassis 101 outside the top of the back side of the chassis 101.

Alternatively in this embodiment, the first fans 127 along the front of the chassis 101 are not removed and are simply left in place while additional first fans 127 are placed along the back of the chassis 101 as described above. As such, the external cool air may be both pulled through the chassis 101 by the first fans 127 at the back of the chassis 101 while also being pushed through the chassis 101 by the first fans 127 located at the front of the chassis 101.

Figure 3A:
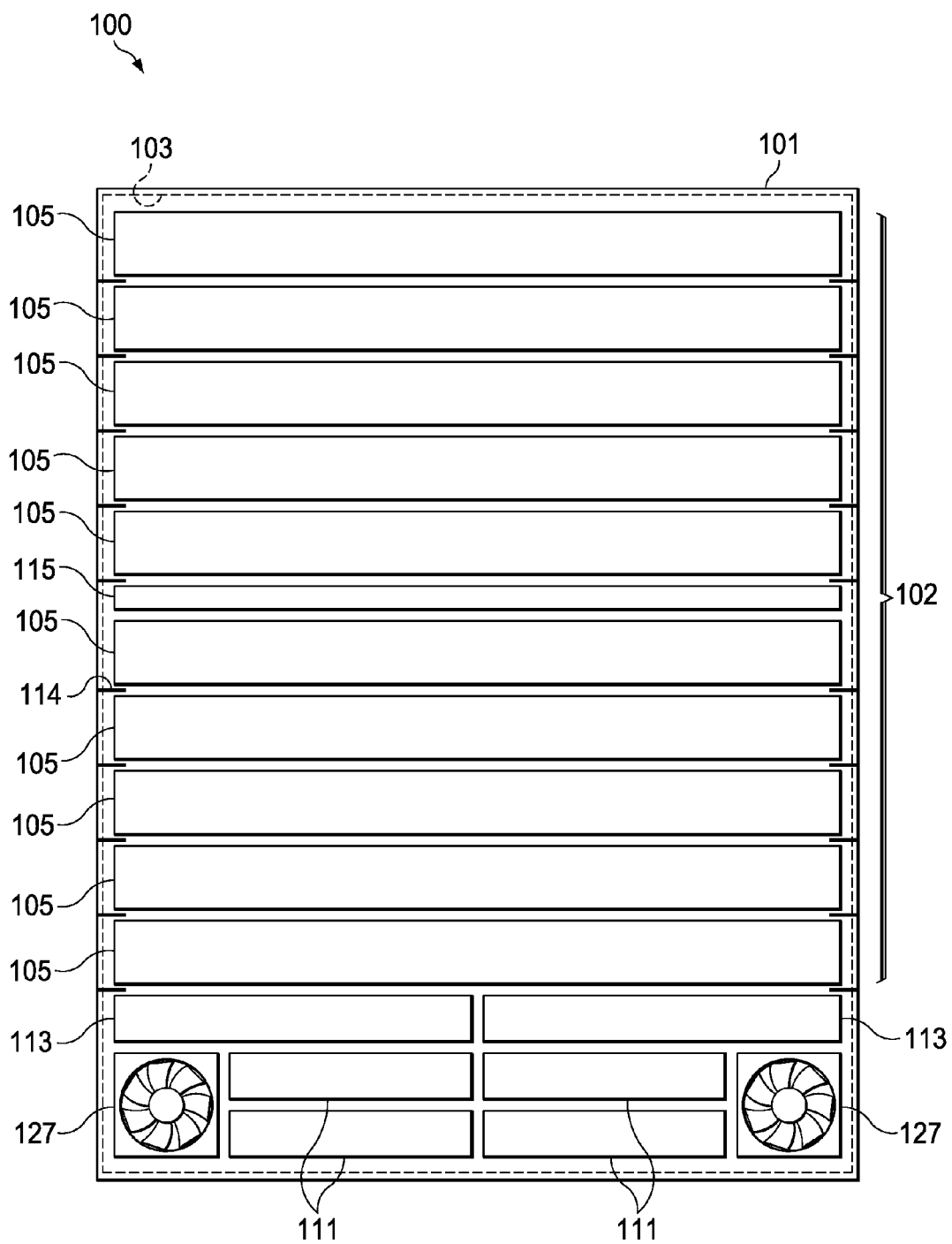
FIGS. 3A-3D illustrate a chassis with first fans in the front edges of the chassis and second fans along the back middle of the chassis in accordance with an embodiment of the present invention.
Figure 3B:
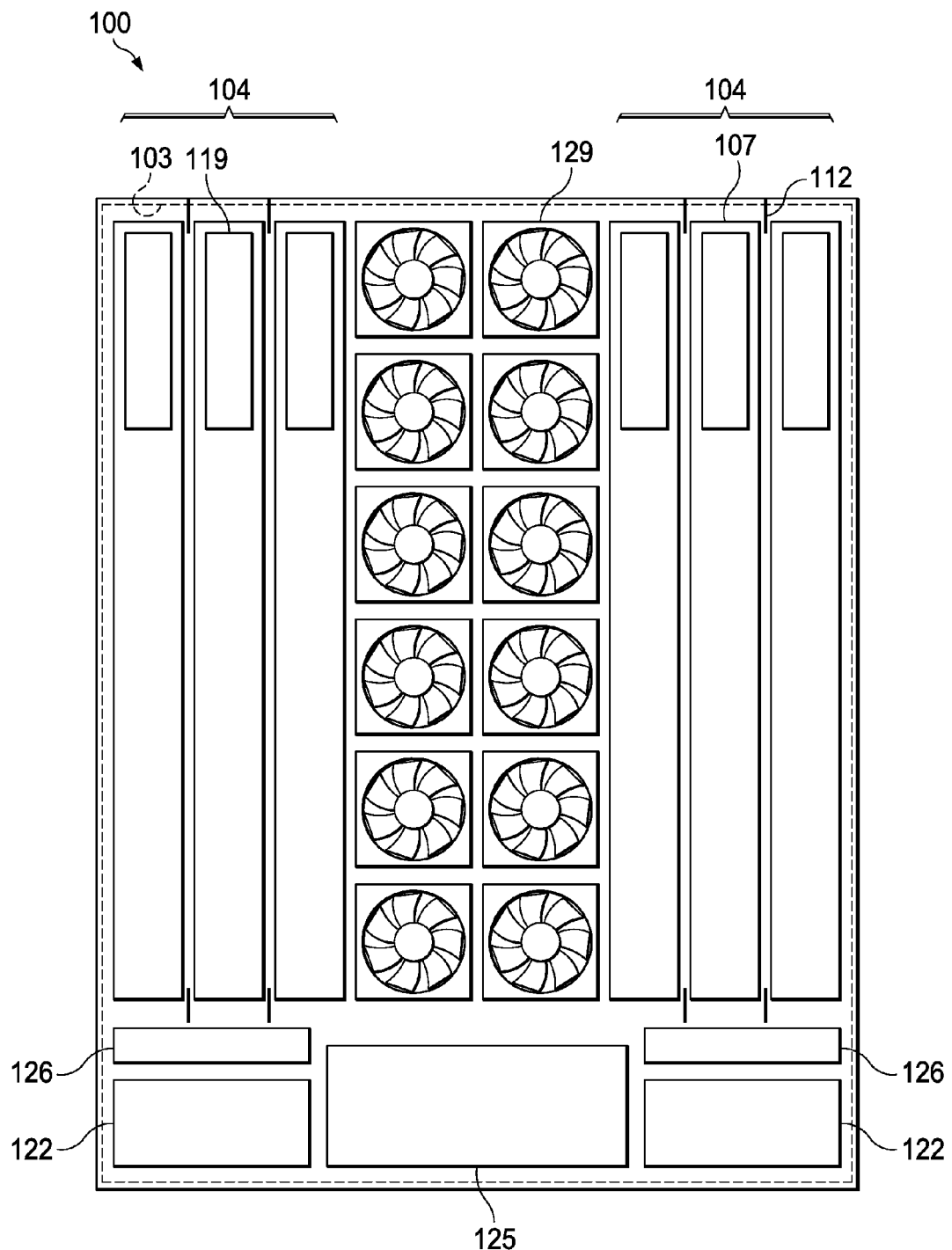
Figure 3C:
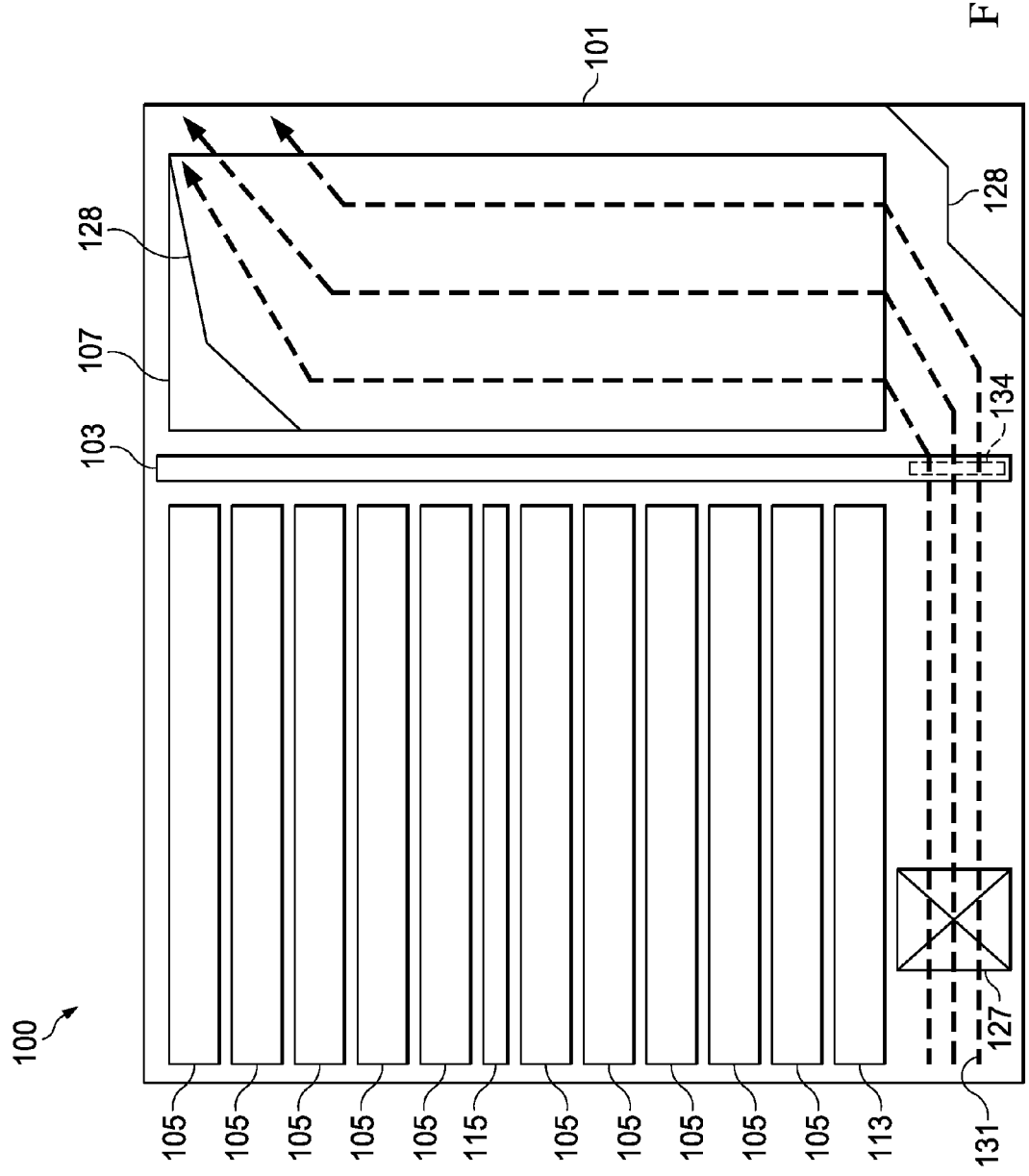
Figure 3D:
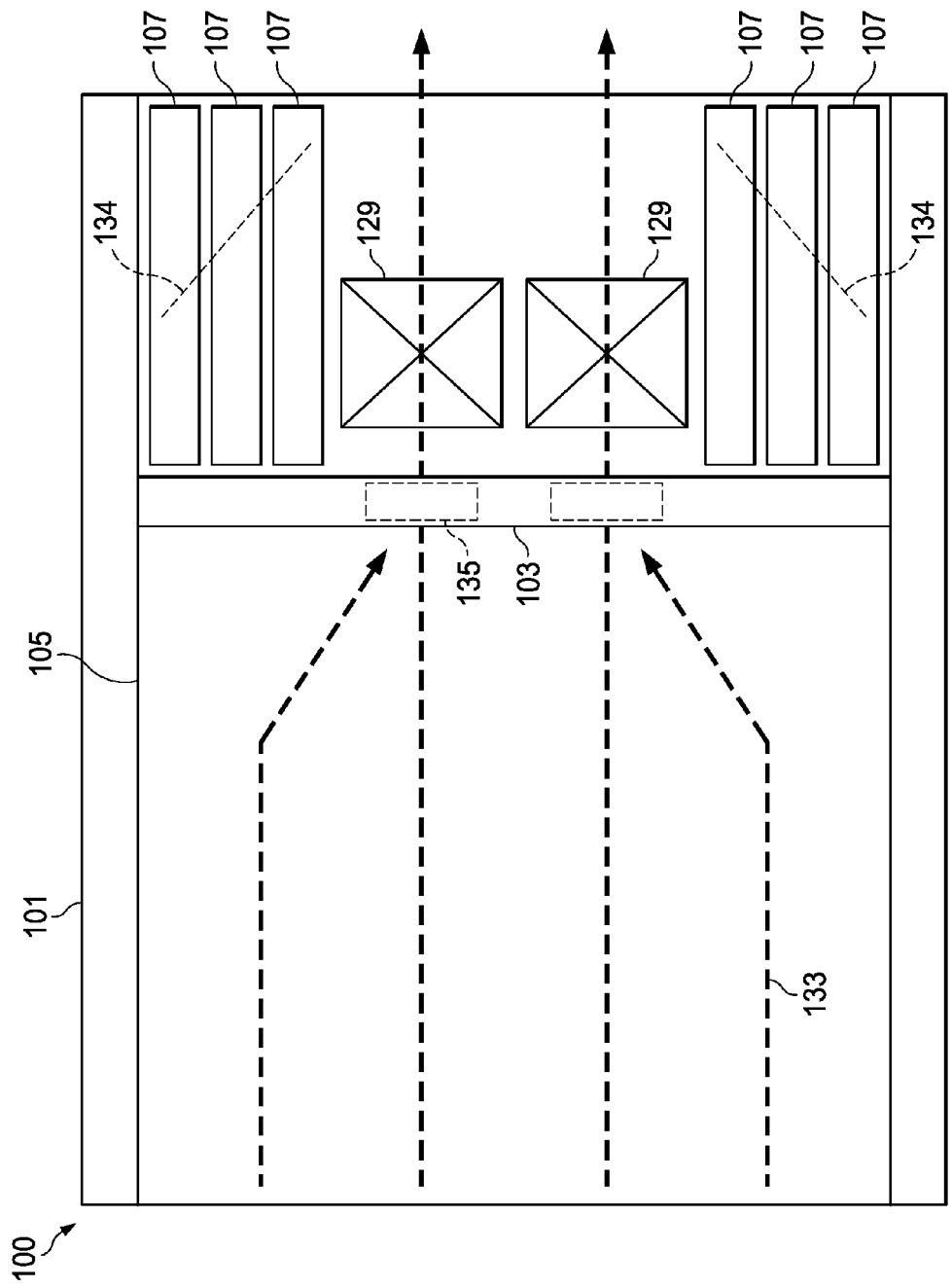

FIGS. 3A-3B illustrate a front-view and a back-view, respectively, of the chassis 101 in a third embodiment of the present invention, and FIGS. 3C-3D illustrate the first air flow 131 and the second air flow 133 in the third embodiment, respectively. As illustrated in FIG. 3A, in this embodiment the positions of the first fans 127 and the load sharing power supplies 111 are reversed so that the first fans 127 are located along the edges of the chassis 101 along the bottom of the chassis 101 while the load sharing power supplies 111 are located in the center of the chassis 101 along the bottom of the chassis 101. FIG. 3B illustrates that, in this embodiment, the position of the second fans 129 has been switched with the position of the vertical second modules 107 such that the second fans 129 are located in the center of the back of the chassis 101 while the vertical second modules 107 are located on the left and right sides of the back of the chassis 101. In such a fashion, the vertical second modules 107 are kept in line with the first fans 127 located at the front of the chassis 101.

Given this placement of the first fans 127, the first fans 127 induce the external fresh cool air to flow as illustrated by the first air flow 131 in FIG. 3C. In particular, the first fans 127 induce the external air to flow horizontally beneath the horizontal first modules 105 and through openings 134 on the backplane 103, vertically over the vertical second modules 107 and out of the chassis 101 through the first air flow opening 119 on the top of the faceplates of the vertical second modules 107. This first air flow 131 follows the reversed "Z" pattern that may similarly be seen in FIG. 1C.

However, differently from the first air flow 131 as shown in FIG. 1C, the first air flow 131 in the third embodiment travels along the outside edge of the chassis 101 instead of being directed down the middle of the chassis 101 as in the embodiment described above with respect to FIGS. 1A-1D. Once at the back of the chassis 101 the first air flow 131 is expanded to more evenly flow over the vertical second modules 107 (using, e.g., air spreaders 134 shown in FIG. 3D), directed vertically over the vertical second modules 107 (using, e.g., air turners 128), and then directed horizontally out of the first air flow openings 119 in the vertical second modules 107.

With this placement, the second fans 129 induce the external air to flow as illustrated in FIG. 3D. In particular, the second fans 129 induce the external air to flow from the front of the chassis 101 through openings on the faceplates of the horizontal first modules 105, through the horizontal first modules 105, through the third air flow openings 152 located in the middle of the backplane 103, through the second fans 129 located in the middle of the back of the chassis 101, and out the back of the chassis 101. However, instead of routing the second air flow to the outside edges of the chassis 101, the second fans 129 will pull the second air flow 133 into the middle of the chassis 101 before expelling the second air flow 133 out of the chassis 101. As such, the external air is used to cool the horizontal first modules 105 and the heat is ultimately removed from the chassis 101.

Figure 4A:
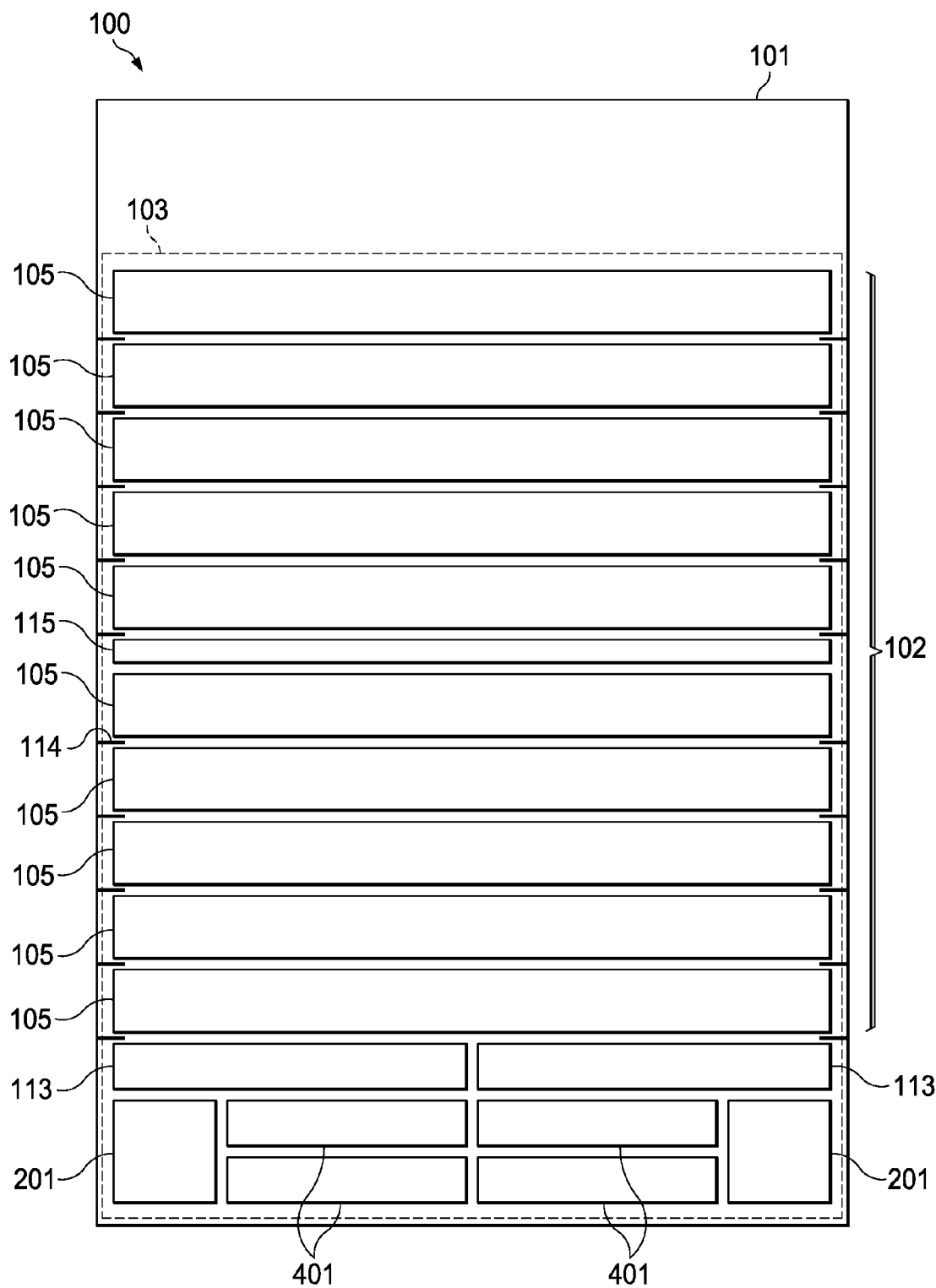
FIGS. 4A-4D illustrate a chassis with first fans in the back top edges of the chassis and second fans along the back middle of the chassis in accordance with an embodiment of the present invention.
Figure 4B:
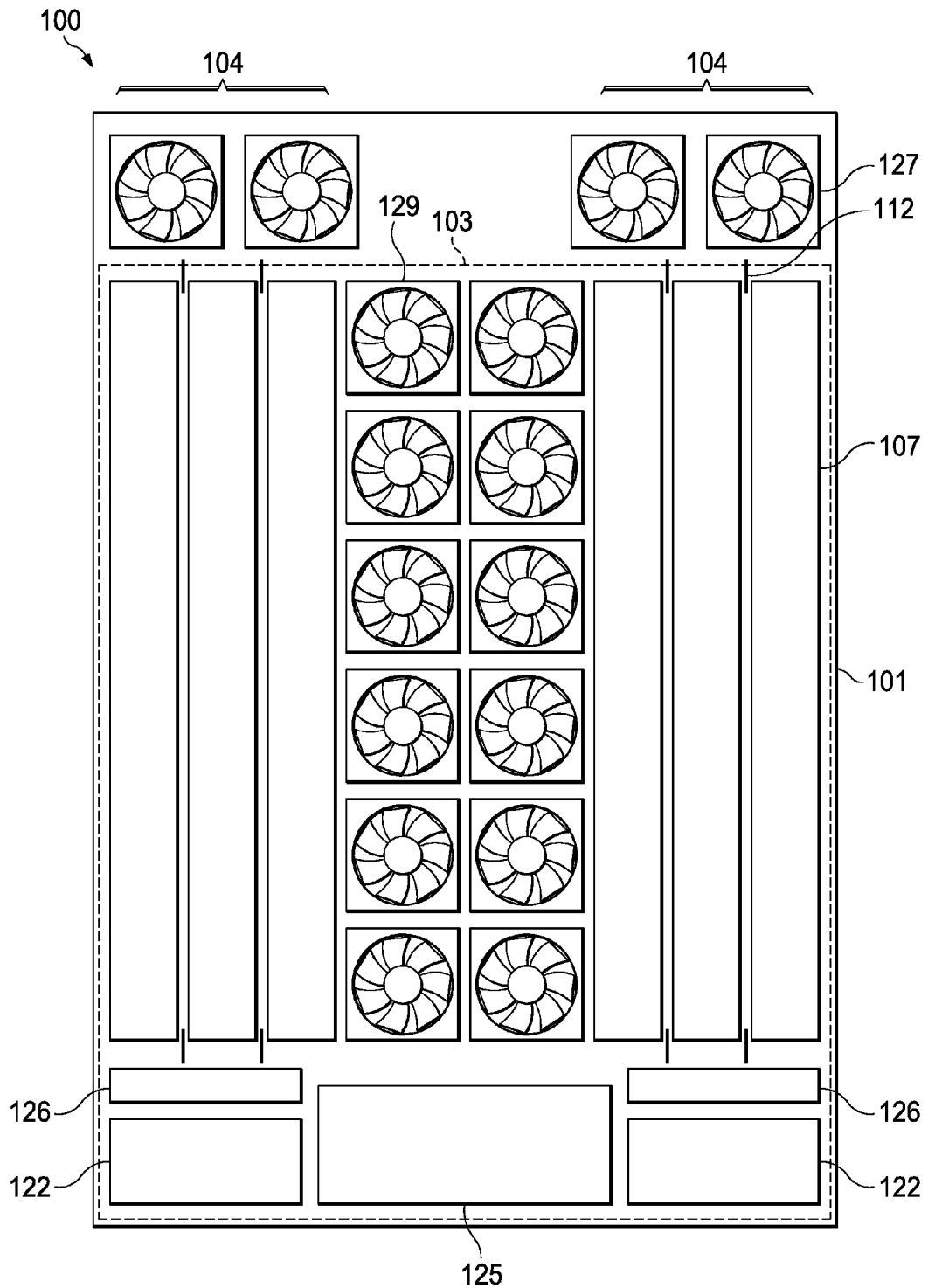
Figure 4C:
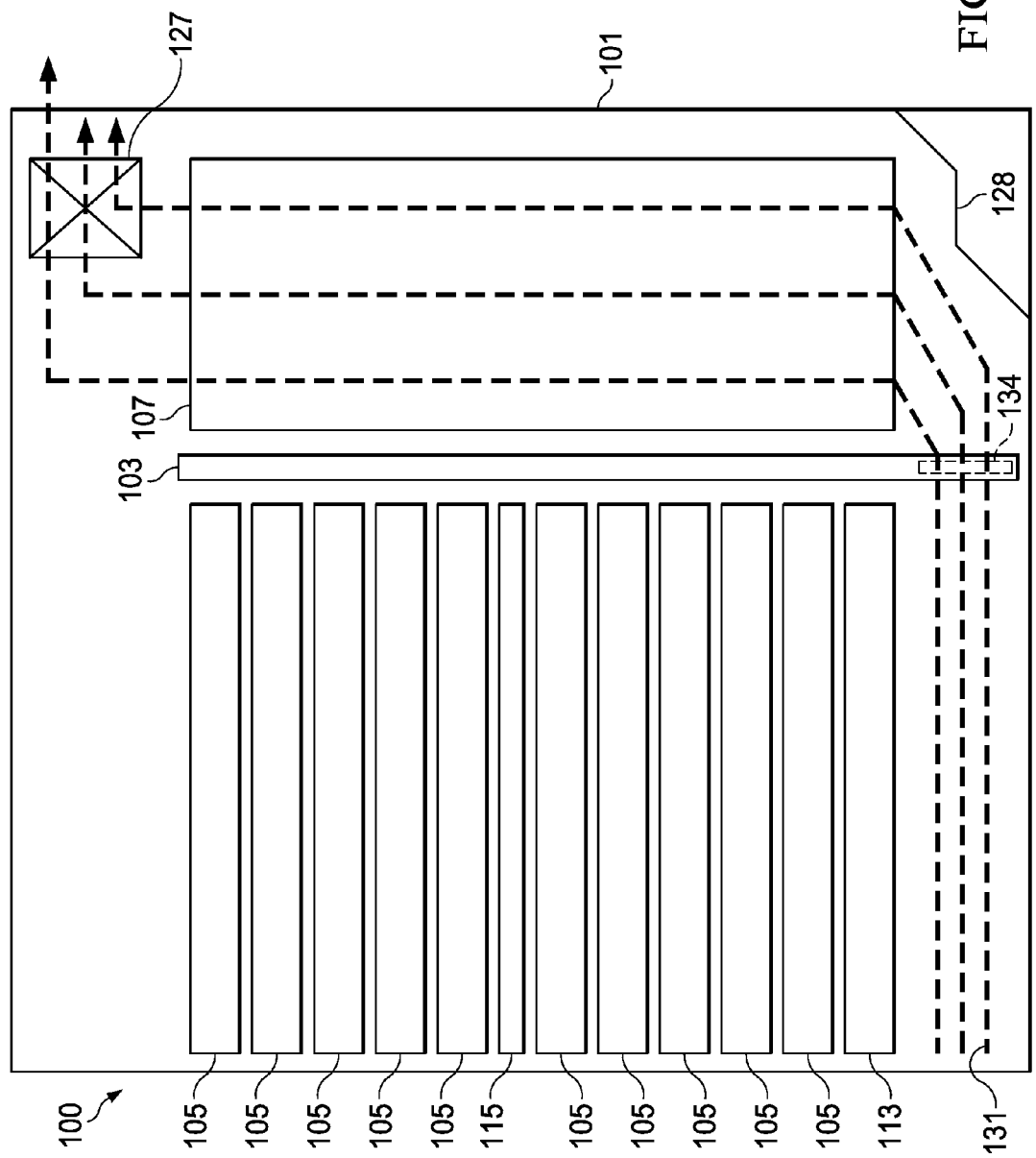
Figure 4D:
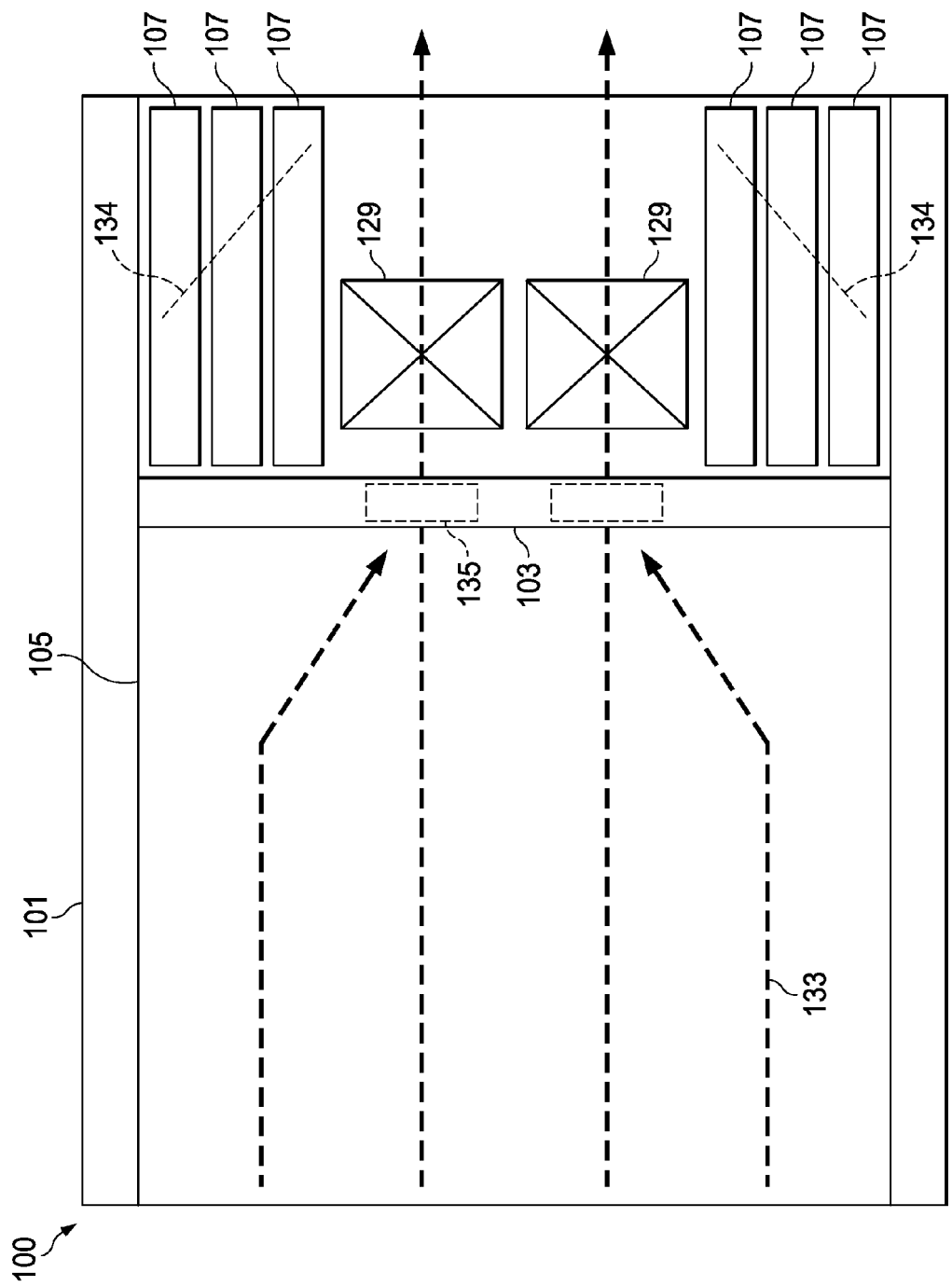

FIG. 4A-4B illustrate a front-view and a back-view, respectively, of the chassis 101 in yet another embodiment of the present invention, with FIGS. 4C-4D illustrating the first air flow 131 and the second air flow 133 associated with this embodiment, respectively. In this embodiment the second fans 129, similar to the third embodiment discussed above with respect to FIGS. 3A-3D, are located in the middle of the back of the chassis 101 as illustrated in FIG. 4B. As such, the second air flow 133 across the horizontal first modules 105 as illustrated in FIG. 4D is similar to the second air flow 133 described above with respect to FIG. 3D.

In this fourth embodiment, however, the first fans 127 are placed along the top of the back of the chassis 101 while the third air flow opening 201 are placed in the front of the chassis 101 in order to allow external air to enter the chassis 101 from the bottom of the front of the chassis 101. However, instead of being located in the middle of the back of the chassis 101 (which would be similar to the embodiment described above with respect to FIG. 2A-2D), the first fans 127 are split into two groups located along an outside edge of the chassis 101, such as the two groups of two first fans 127 each illustrated in FIG. 4B. Power supply modules 401 may provide power to the horizontal first modules 105 and vertical second modules 107 in the chassis 101.

FIG. 4C illustrates the first air flow 131 through the chassis 101 with the first fans 127 located along the top of the chassis 101 at the sides. Similar to the first air flow 131 described above with respect to FIG. 2C, the first air flow 131 in this embodiment follows the reverse "Z" shape, wherein the first air flow travels along the bottom of the chassis 101 beneath the horizontal first modules 105 and through opening 134 on the backplane 103, vertically across the vertical second modules 107, and then is pulled horizontally through the first fans 127 before being expelled from the chassis 101. However, while the first air flow 131 in FIG. 4C is similar to FIG. 2C, the first air flow 131 in FIG. 4C is pulled by the first fans 127 along an outer edge of the chassis 101 in order to flow across the vertical second modules 107 located along the outer edge of the chassis 101.

By providing for the first air flow 131 across the horizontal first modules 105 and the second air flow 133 across the vertical second modules 107 (in the reverse "Z" shape of air flow), a hybrid air flow may be realized that is especially efficient when used with an orthogonal backplane in which some blades are positioned horizontally and other blades are positioned vertically. Such a hybrid air flow allows for the efficient cooling of all components embodied within the chassis 101 even as the speed of the components and, therefore, their generation of heat, is increased into future generations of data transfer.

Figure 5A:
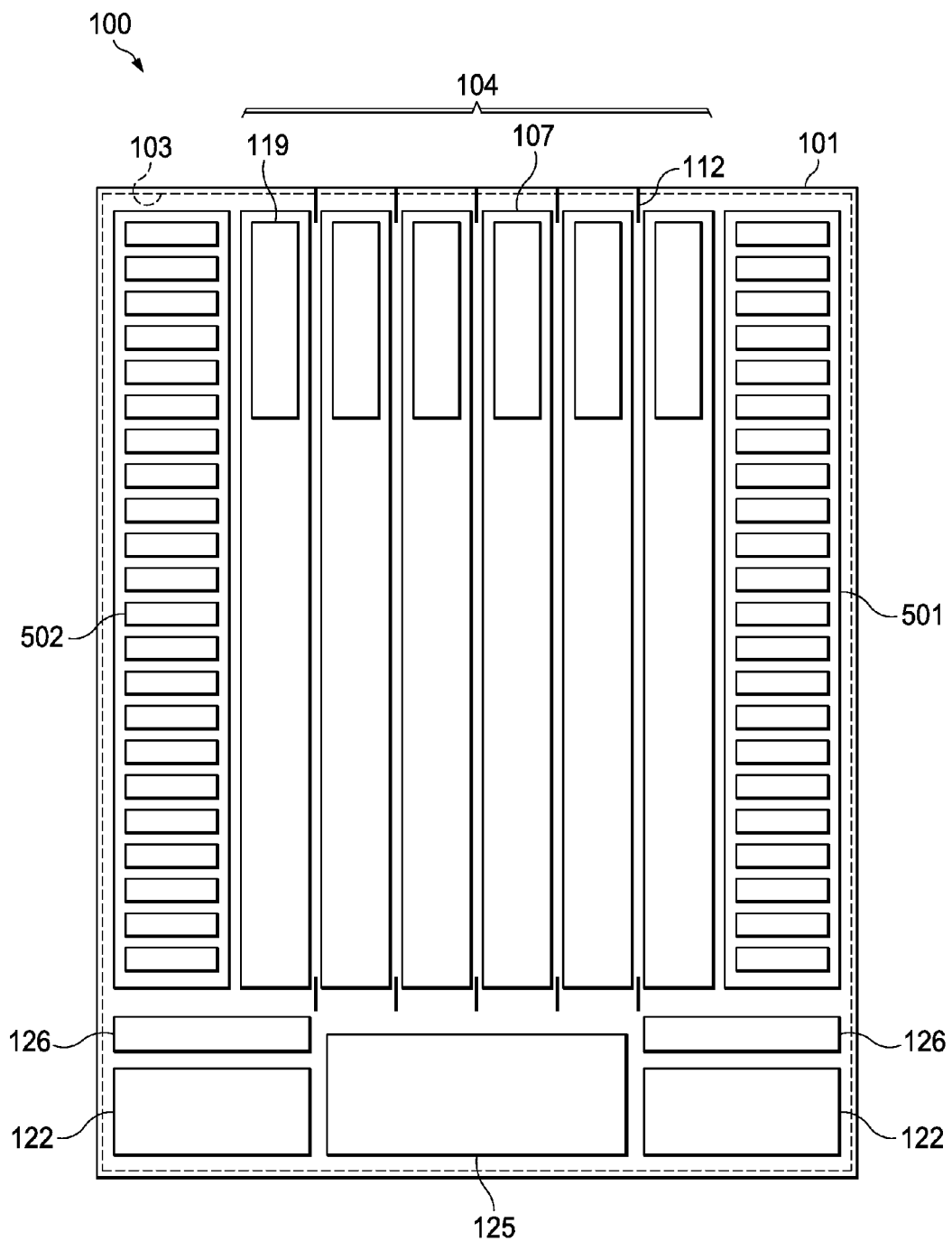
FIGS. 5A-5B illustrate a chassis with liquid cooling components in accordance with an embodiment of the present invention.

FIG. 5A illustrates yet another embodiment in which the second fans 129 may be replaced with two liquid cooling heat exchangers 501 to pull and cool the hot air from the horizontal first modules 105 before it is exhausted out of the chassis 101 for higher data center cooling efficiency.

Figure 5B:
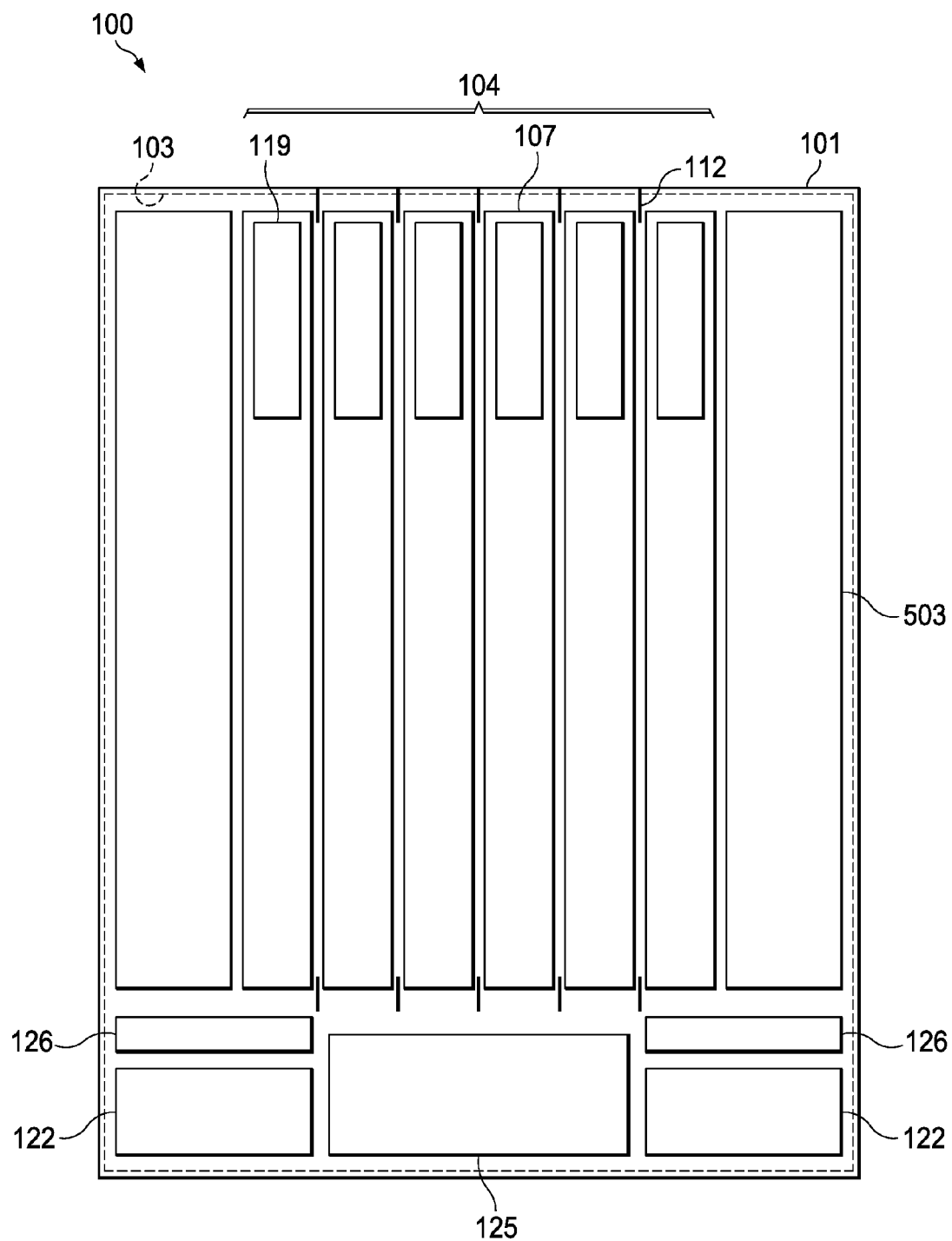
Figure 6A:
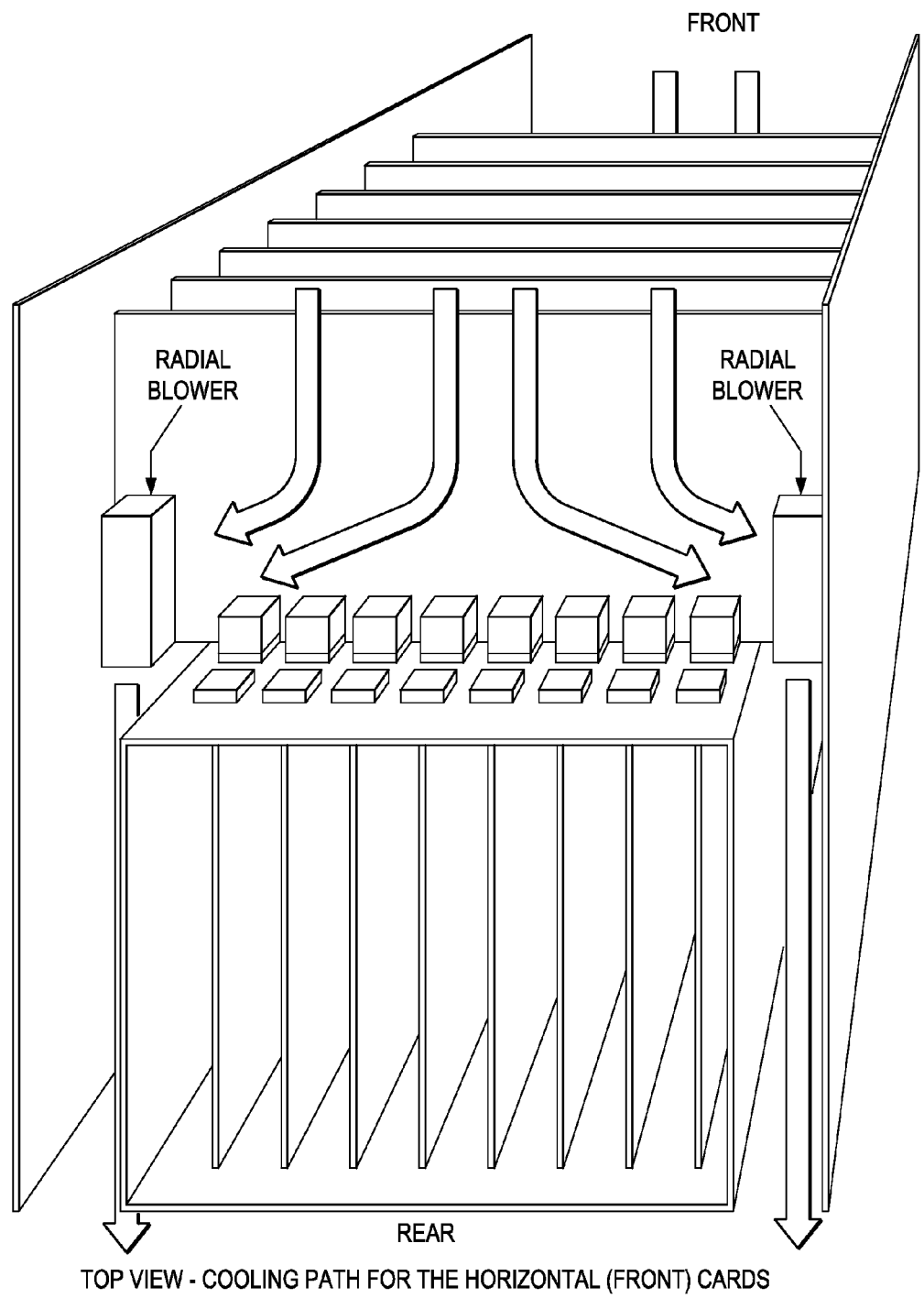
FIGS. 6A-6B illustrate a chassis in the prior art.
Figure 6B:
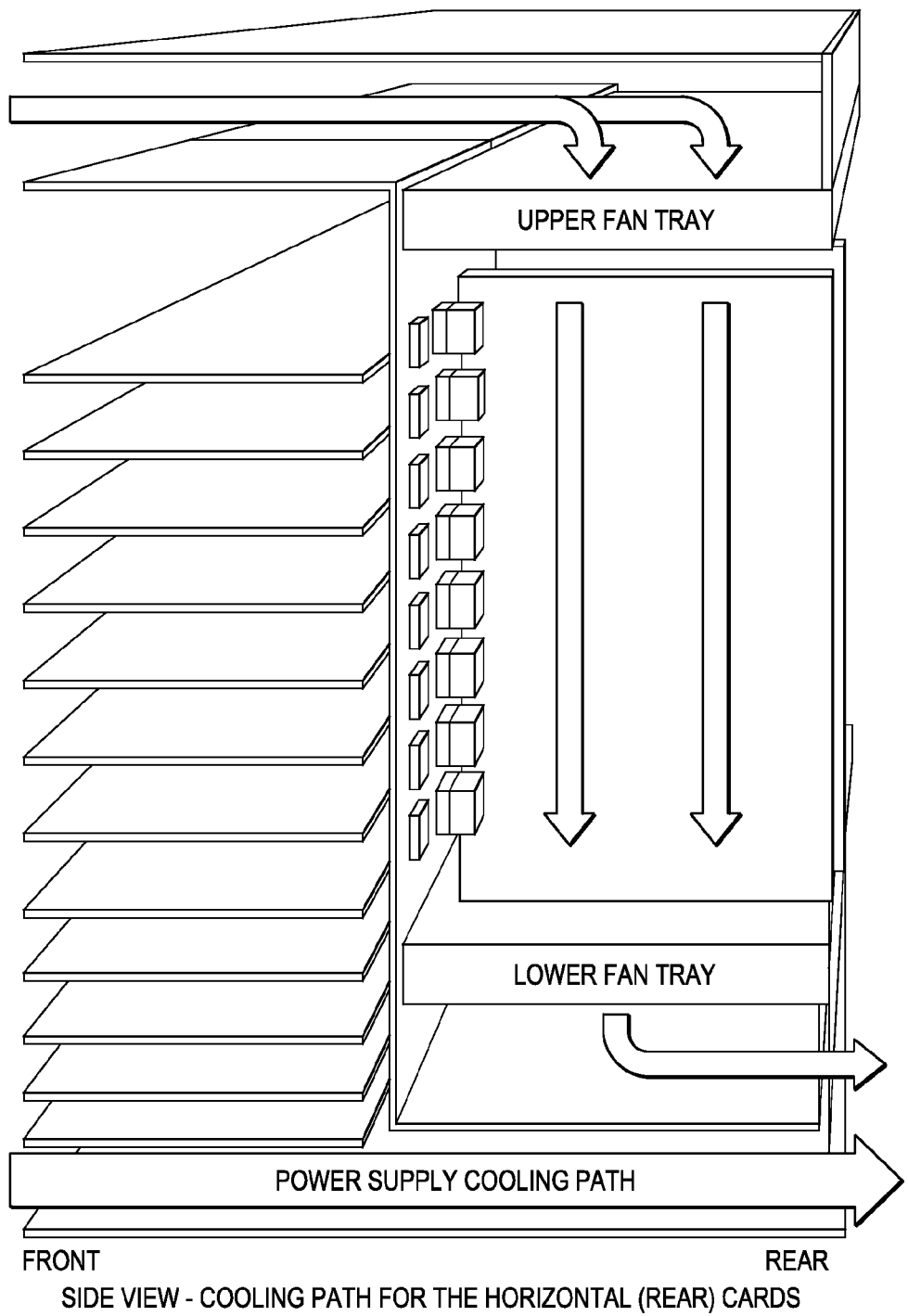

FIG. 5B illustrates yet another liquid embodiment in which the second fans 129 may be replaced with two liquid cooling tanks 503 in order to provide cooling fluid to the horizontal first modules 105 in the front of the chassis 101. The cooling fluid may be routed from one of the liquid cooling tanks 503 to the horizontal first modules 105 using suitable tubing that routes the cooling fluid through the openings in the backplane 103 to the horizontal first modules 105, and back to the second liquid cooling tank 503. Such routing of the cooling fluid allows the horizontal first modules 105 to be cooled beyond the cooling capacity of the external air or the liquid cooling heat exchangers 501.

Although the present invention and its advantages have been described in detail, it should be understood that various changes, substitutions and alterations can be made herein without departing from the spirit and scope of the invention as defined by the appended claims. For example, many different types of blades may be connected to the backplane. As another example, it will be readily understood by those skilled in the art that connections and positions may be varied while remaining within the scope of the present invention.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electronic system comprising:
   a first region adjacent to a first side, the first region comprising first sections for accepting first modules positioned in a first direction;
   a second region adjacent to a second side, the second side being opposite the first side, the second region comprising second sections for accepting second modules positioned in a second direction orthogonal to the first direction; and
   a hybrid air flow path comprising:
      a first air flow path having a first entrance in the first side, a first portion beneath the first region but not entering the first region, a second portion between the second sections, and a first exit either through openings on top parts of faceplates of the second modules or through fans in the second side; and
      a second air flow path having a second entrance at the first side through openings on faceplates of the first modules in the first region, a third portion between the first sections, aligned and suitable openings on a backplane, and a second exit in the second side.

2. The electronic system of claim 1, further comprising a first fan located at the first entrance.

3. The electronic system of claim 1, further comprising a first fan located at the first exit.

4. The electronic system of claim 1, wherein the first entrance is located in a bottom middle of a front of a chassis.

5. The electronic system of claim 1, wherein the first entrance is located along an edge of a front of a chassis.

6. The electronic system of claim 1, wherein the first exit is through openings on top parts of faceplates of the second modules.

7. The electronic system of claim 1, wherein the first exit is the fans.

8. A chassis comprising:
   a first region located in a front of the chassis, the first region having horizontal sections;
   a second region located in a back of the chassis, the second region having vertical sections;
   first fans located to induce air to flow beneath the first region, flow through the second region, and exit the back of the chassis, wherein the air flow through the second region is vertical between the vertical sections; and
   second fans located to induce air to flow through the first region and exit the back of the chassis.

9. The chassis of claim 8, wherein the first fans are located along a bottom middle of the front of the chassis and wherein the second fans are located along an edge of the back of the chassis.

10. The chassis of claim 8, wherein the first fans are located along an edge of the front of the chassis and wherein the second fans are located in a middle of the back of the chassis.

11. The chassis of claim 8, wherein the first fans are located along a top middle of the back of the chassis and the second fans are located along an edge of the back of the chassis.

12. The chassis of claim 8, further comprising third fans located along a top middle of the back of the chassis and wherein the first fans are located along a bottom middle of the front of the chassis.

13. The chassis of claim 8, wherein the first fans are located along a top edge of the back of the chassis and the second fans are located in a middle of the back of the chassis.

14. The chassis of claim 8, further comprising air turners located at the back of the chassis.

15. The chassis of claim 8, further comprising first modules located in the first region and second modules located in the second region, the first modules being aligned orthogonally to the second modules.

16. A cooling system for a chassis comprising:
   first modules located in a front region of the chassis;
   second modules located in a rear region of the chassis, the second modules arranged orthogonally to the first modules;
   a first entrance at a front of the chassis, a first exit at a back of the chassis, and a first path between the first entrance and the first exit, wherein the first path is a reverse Z and passes between the second modules but not between the first modules; and
   a second entrance, a second exit, and a second path between the second entrance and the second exit, wherein the second path passes between the first modules.

17. The cooling system of claim 16, further comprising a first fan located at the first entrance.

18. The cooling system of claim 16, further comprising a first fan located at the first exit.

19. The cooling system of claim 16, wherein the first entrance is located along a bottom middle of the front of the chassis.

20. The cooling system of claim 16, wherein the first entrance is located along a bottom edge of the front of the chassis.

21. The cooling system of claim 16, wherein the first exit is located at the back of the chassis.

22. The cooling system of claim 16, further comprising a liquid cooling heat exchanger located at the second exit.

23. The cooling system of claim 16, further comprising:
   a cooling liquid tank located at the second exit; and
   tubing running along the second path and connecting cooling appliance such as heatsinks on the first modules, the tubing connected to the cooling liquid tank.

24. A chassis comprising:
   a first set of rails aligned in a first direction located in a front region of the chassis;
   a second set of rails aligned in a second direction orthogonal to the first direction, the second set of rails located in a back region of the chassis;
   a first air flow path having a first horizontal portion beneath the front region, having a first vertical portion through the back region, and having a first exit out of a back of the chassis; and
   a second air flow path having a second portion through the front region and having a second exit out of the back of the chassis, wherein the second portion of the second air flow path is parallel with the first horizontal portion of the first air flow path.

25. The chassis of claim 24, further comprising at least one fan positioned along the first horizontal portion of the first air flow path to induce an air flow along the first air flow path.

26. The chassis of claim 25, further comprising at least one fan positioned at the first exit.

27. An electronic system comprising:
   a first plurality of modules within a first region of a chassis;
   a second plurality of modules within a second region of the chassis, the second plurality of modules arranged orthogonally to the first plurality of modules;
   a first air flow path comprising:
      a first entrance at a front of the chassis;
      a first portion extending completely beneath the first region;
      a second portion perpendicular with the first portion that completely extends through the second region; and
      an exit out of a back of the chassis;
   a second air flow path comprising:
      second entrance at the front of the chassis;
      a first portion through the first region between the first plurality of modules; and
      a second exit out of the back of the chassis.

28. The electronic system of claim 27, further comprising at least one fan positioned along the first portion.

29. The electronic system of claim 27, further comprising air turners located at the back of the chassis.

* * * * *